(12) United States Patent
Suekane et al.

(10) Patent No.: US 9,707,846 B2
(45) Date of Patent: Jul. 18, 2017

(54) CONNECTION SYSTEM

(71) Applicant: Sharp Kabushiki Kaisha, Osaka-shi, Osaka (JP)

(72) Inventors: Tomoaki Suekane, Osaka (JP); Hiroshi Kawamura, Osaka (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 403 days.

(21) Appl. No.: 14/595,307

(22) Filed: Jan. 13, 2015

(65) Prior Publication Data

US 2015/0210167 A1     Jul. 30, 2015

(30) Foreign Application Priority Data

Jan. 24, 2014 (JP) ................................ 2014-011464

(51) Int. Cl.
| | |
|---|---|
| *B60L 3/00* | (2006.01) |
| *B60L 3/04* | (2006.01) |
| *B60L 11/18* | (2006.01) |
| *H02H 3/20* | (2006.01) |
| *H02H 9/02* | (2006.01) |
| *H02H 3/05* | (2006.01) |
| *G01R 31/327* | (2006.01) |

(52) U.S. Cl.
CPC ............. *B60L 3/04* (2013.01); *B60L 11/18* (2013.01); *H02H 3/202* (2013.01); *H02H 9/02* (2013.01); *B60L 2230/12* (2013.01); *G01R 31/3278* (2013.01); *H02H 3/05* (2013.01); *Y02T 10/7088* (2013.01); *Y02T 90/12* (2013.01); *Y02T 90/121* (2013.01)

(58) Field of Classification Search
None
See application file for complete search history.

(56) References Cited

U.S. PATENT DOCUMENTS

2006/0067021 A1* 3/2006 Li .................... H01C 7/126
                                                    361/30
2012/0200967 A1* 8/2012 Mikolajczak .......... H02H 3/20
                                                    361/79

FOREIGN PATENT DOCUMENTS

| CN | 2407491 Y | 11/2000 |
|---|---|---|
| CN | 1858950 A | 11/2006 |
| JP | 2013-074762 A | 4/2013 |
| SU | 989551 A2 | 1/1983 |

OTHER PUBLICATIONS

Official Communication issued in corresponding European Patent Application No. 15000144.4, mailed on Nov. 12, 2015.
"Effects of Current on Human Beings and Livestock—Part 1: General Aspects," IEC/TS 60479-1, Edition. 4.0, Jul. 2005, 23 pages.

\* cited by examiner

*Primary Examiner* — Long Nguyen
(74) *Attorney, Agent, or Firm* — Keating & Bennett, LLP

(57) ABSTRACT

A connection system forms an electric path through which power transmission is performed between an electric vehicle and a power conditioner system. The electric vehicle includes a relay circuit that opens the electric path if a voltage equal to or above a predetermined value is applied between voltage output terminals. The connection system includes a fuse that blows in response to a current input thereto equal to or above a predetermined value and a resistor connected in parallel with the fuse.

16 Claims, 19 Drawing Sheets

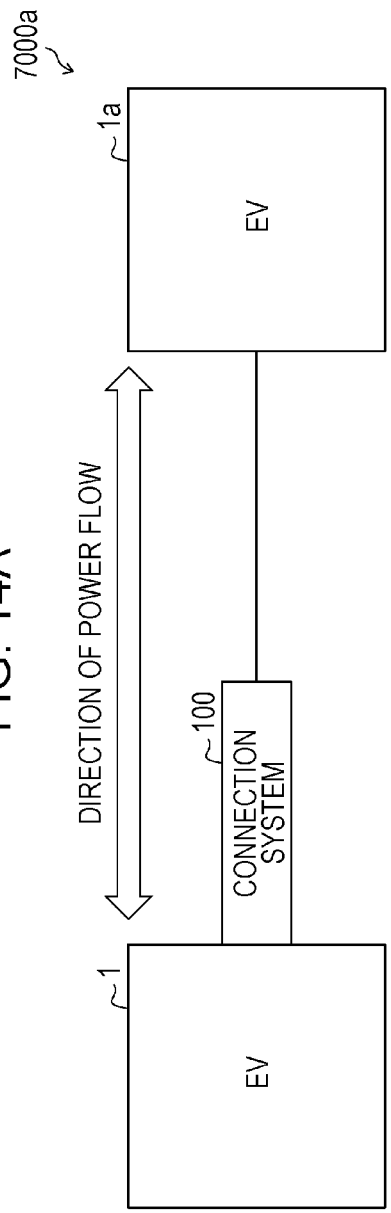
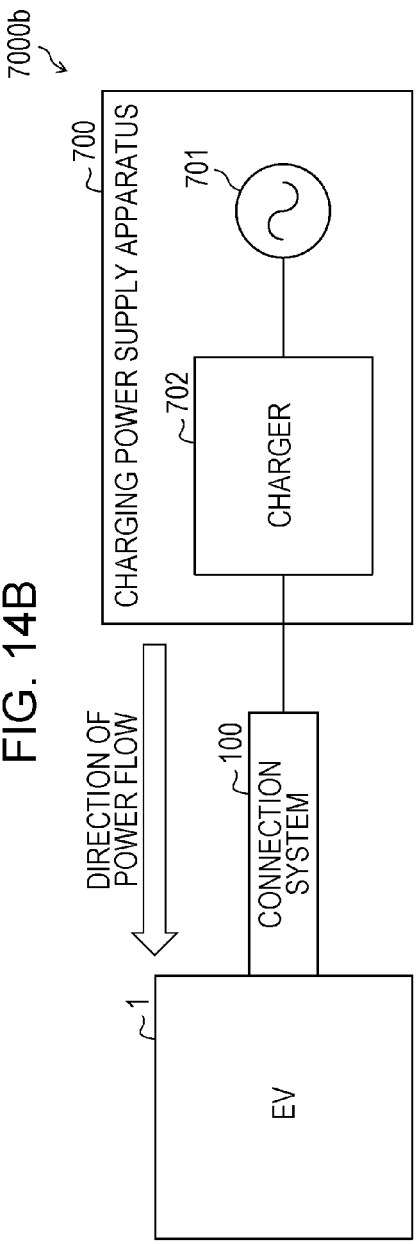

FIGURE 20 – CONVENTIONAL TIME/CURRENT ZONES OF EFFECTS OF AC CURRENTS (15 Hz TO 100 Hz) ON PERSONS FOR A CURRENT PATH CORRESPONDING TO LEFT HAND TO FEET (FOR EXPLANATION SEE TABLE 11)

FIGURE 22 – CONVENTIONAL TIME/CURRENT ZONES OF EFFECTS OF DC CURRENTS ON PERSONS FOR A LONGITUDINAL UPWARD CURRENT PATH (FOR EXPLANATION SEE TABLE 13)

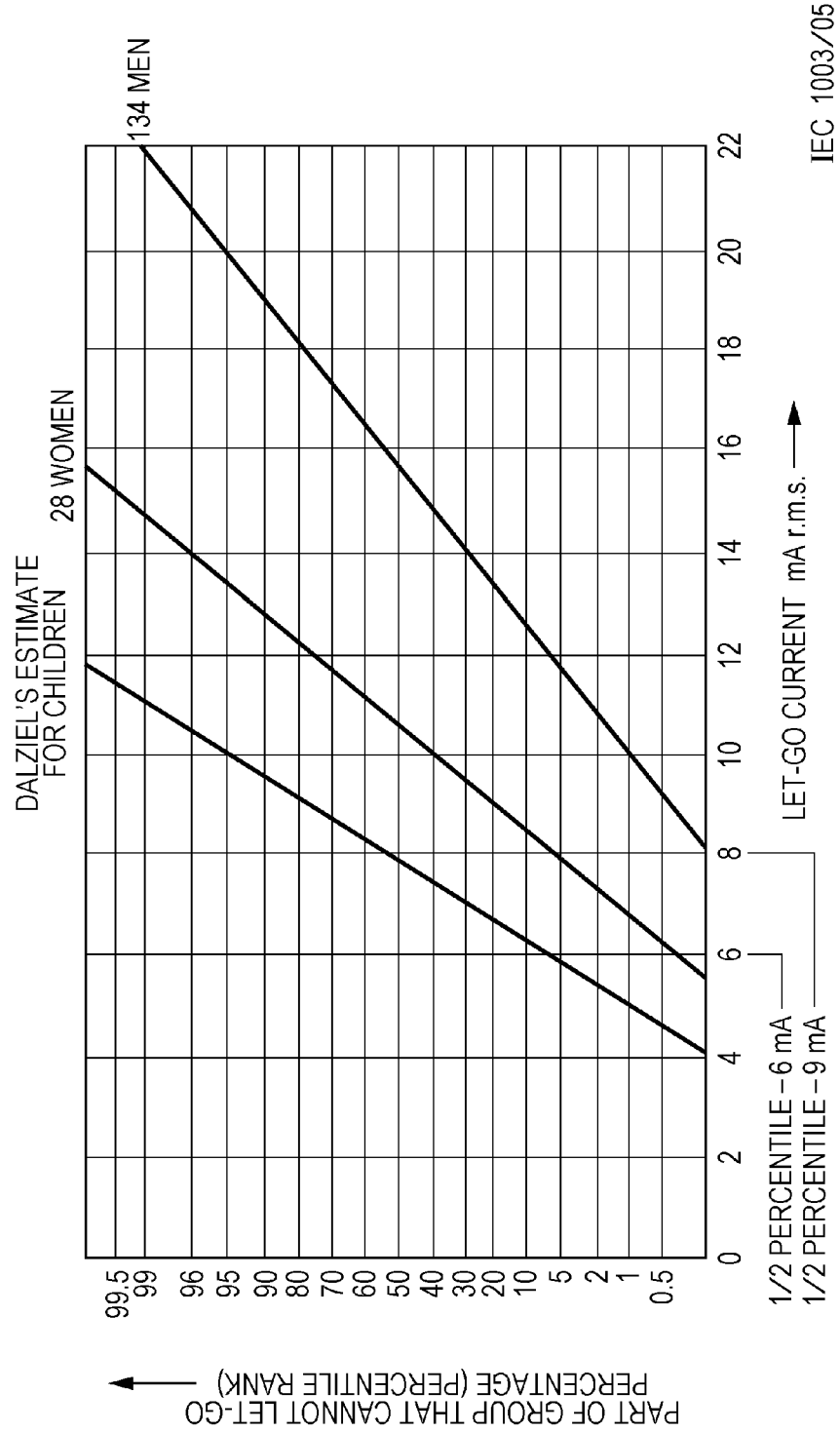

CONNECTION SYSTEM

BACKGROUND

1. Field

The present disclosure relates to a connection system to connect a power supply apparatus to a load apparatus.

2. Description of the Related Art

Electric vehicles (EVs) equipped with rechargeable batteries are in widespread use today.

To charge a battery, power is supplied to the EV from an external power supply apparatus. To discharge the battery, power is supplied from the EV to a load apparatus external to the EV.

A variety of techniques have been disclosed to ensure reliability of power transmission of the EV (namely, charging and discharging of the battery). Japanese Unexamined Patent Application Publication No. 2013-74762 discloses an arrangement in which a fuse to block an excessive current is mounted in a connection plug forming an electric path between a power supply apparatus (or a load apparatus) and an EV.

A fuse, if ideal, has a zero operation time to block an excessive current. In other words, an ideal fuse would be blown at the moment an excessive current flows. The electric path is thus opened, blocking the excessive current.

However, the operation time of an actual fuse to block an excessive current is not zero. The actual fuse is unable to block an excessive current through a duration of time from (i) the moment the excessive current flows to (ii) the moment the fuse is blown (namely, the operation time).

The technique disclosed in Japanese Unexamined Patent Application Publication No. 2013-74762 does not take into account the operation time of the fuse. In the technique disclosed in Japanese Unexamined Patent Application Publication No. 2013-74762, there is a possibility that an excessive current instantaneously flows through the electric path between the EV and the load apparatus when power is supplied to from the EV to the load apparatus.

To protect the electric path, a protection circuit (such as an over-voltage protection relay) may be arranged in the EV. Even with the protection circuit, however, an excessive current may flow instantaneously when a fuse is blown and may weld the protection circuit. If the protection circuit malfunctions as a result of welding, the value of a voltage applied between input terminals of the load apparatus is difficult to accurately measure. Reliability of the power transmission is thus degraded.

The problem created by the welded protection circuit is described in detail below by exemplifying a comparison example to a first embodiment of the disclosure with reference FIG. 15, and FIG. 16.

SUMMARY

It is desirable to provide a connection system that improves reliability of power transmission.

According to an aspect of the disclosure, a connection system is provided. The connection system is configured to be connected between voltage output terminals of power supply apparatus and voltage input terminals of a load apparatus in order to form an electric path between the power supply apparatus and the load apparatus for power transmission. The connection system includes in the electric path an excessive current blocking element that blows in response to a current equal to or above a predetermined value flowing thereinto, and a resistor connected in parallel with the excessive current blocking element. The power supply apparatus includes an over-voltage protection circuit that opens the electric path if a value of a voltage between the voltage output terminals is equal to or above a predetermined value.

BRIEF DESCRIPTION OF THE DRAWINGS

FIG. 14A and FIG. 14B diagrammatically illustrate the configuration of the power system of a seventh embodiment of the disclosure;

FIG. 19 corresponds to FIG. 23 cited from "Effects of current on human beings and livestock—Part 1", Technical Specification IEC/TS 60479-1 Ed. 4.0: 2005(b).

DESCRIPTION OF THE EMBODIMENTS

A first embodiment of the disclosure is described with reference to FIG. 1 and FIG. 2.

Configuration of Power System 1000

Figure 1:
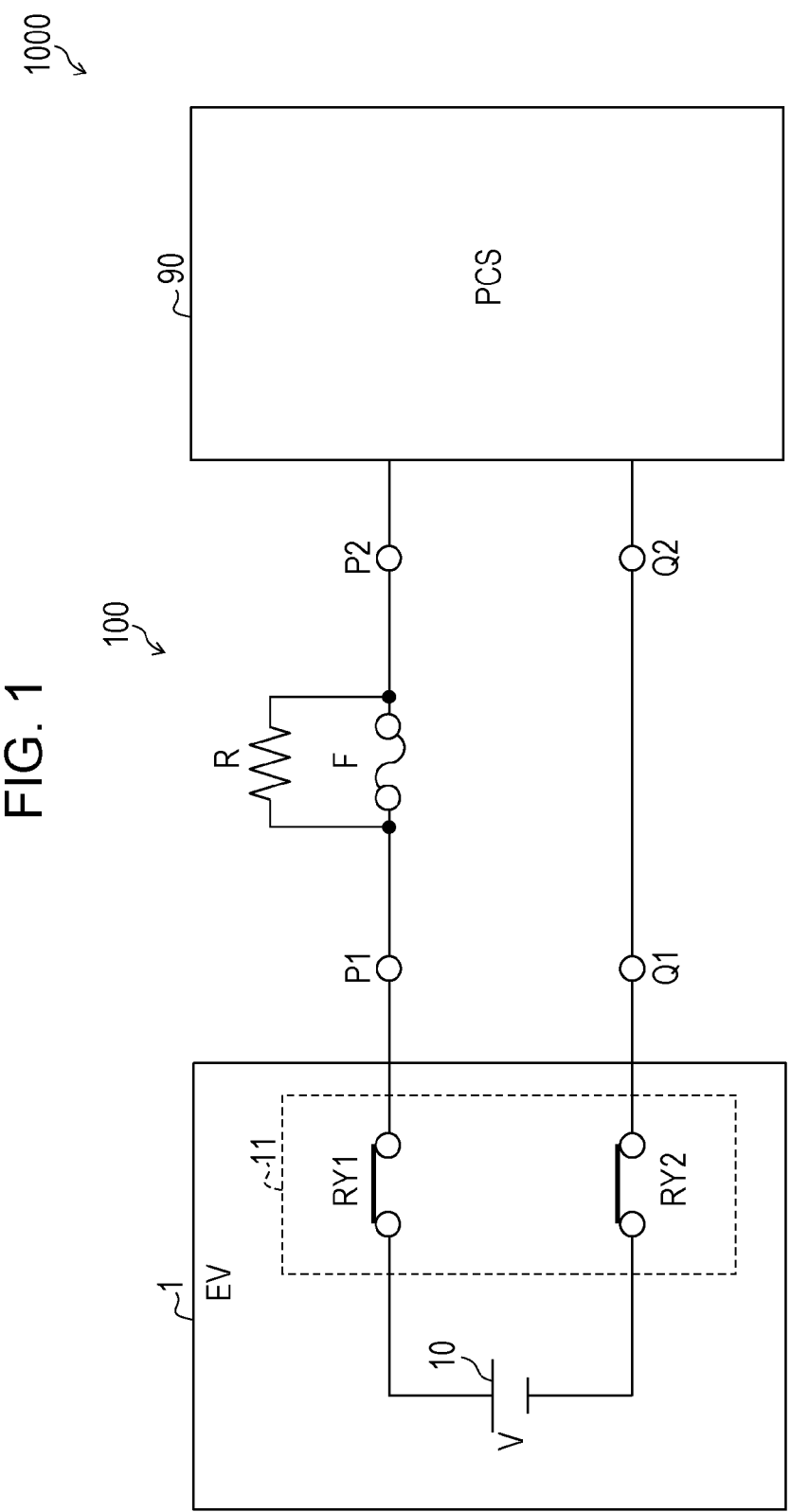
FIG. 1 illustrates a configuration of a power system of a first embodiment of the disclosure.

FIG. 1 illustrates the configuration of a power system 1000 of the first embodiment. The power system 1000 includes an electric vehicle (EV) 1 (power supply apparatus), a power conditioner system (PCS) 90 (load apparatus), and a connection system 100.

The connection system 100 is connected between the EV 1 and the PCS 90 to form an electric path. Power is transmitted via the electric path between the EV 1 and the PCS 90. The connection system 100 may also referred to as a connection circuit.

Connection System 100

The connection system 100 includes a resistor R and a fuse F (an excessive current blocking element). In the connection system 100, the resistor R and the fuse F are connected in parallel. One terminal of each of the resistor R and the fuse F is connected to an output terminal P1 of the EV 1 (a voltage output terminal). The other terminal of each of the resistor R and the fuse F is connected to an input terminal P2 of the PCS 90 (a voltage input terminal).

The fuse F is blown if a current equal to or above a predetermined value (30 A, for example) flows thereinto. In other words, the fuse F is an excessive current protection element that opens the electric path to control an excessive current that flows from the output terminal P1 to the input terminal P2.

EV1

The EV 1 includes a battery 10 that is chargeable and dischargeable. The battery 10 is regarded as a direct-current power source that outputs direct-current power. The EV-1 includes two output terminals P1 and Q1 (voltage output terminals) as connection points with the connection system 100.

The EV 1 further includes a relay circuit 11. The relay circuit 11 includes two relays, namely, a relay RY1 and a relay RY2. Each of the relays RY1 and RY2 includes two terminals.

One terminal of the relay RY1 is connected to the positive side of the battery 10. The other terminal of the relay RY1 is connected to the output terminal P1 of the EV 1. The positive side of the battery 10 is thus connected to the resistor R and the fuse F included in the connection system 100 via the relay RY1 and the output terminal P1.

One terminal of the relay RY2 is connected to the negative side of the battery 10. The other terminal of the relay RY2 is connected to the output terminal Q1 of the EV 1.

The relay circuit 11 is a protection circuit that is arranged to control an excessive current flowing from the EV 1 to the PCS 90. If a current equal to or above a predetermined value (1 kA, for example) is applied to the relay circuit 11, the relay circuit 11 opens the electric path. More specifically, if a current equal to or above the predetermined value is applied to the relay circuit 11, the relay RY1 and the relay RY2 are set to be in an open state.

The relay circuit 11 is intended to control the application of an excessive voltage between the input terminals P2 and Q2 of the PCS 90. The relay circuit 11 is thus an over-voltage protection circuit that opens the electric path between the output terminal P1 and the input terminal P2 and the electric path between the output terminal Q1 and the input terminal Q2.

The relay circuit 11 is the over-voltage protection circuit that opens the electric path if the value of the voltage between the output terminals P1 and Q1 of the EV 1 is equal to or above a predetermined value (300 V, for example).

PCS 90

The PCS 90 is a load apparatus that the battery 10 of the EV 1 supplies power to. The PCS 90 is a power conditioner, and has a function of an inverter that inverts a direct-current (DC) voltage from the battery 10 to an alternating-current (AC) voltage.

The PCS 90 supplies the AC voltage to a variety of external apparatuses (not illustrated). The PCS 90 converts the power supplied from the EV 1 into power appropriate for a variety of external load apparatuses. The power supplied from the EV 1 may be used for a variety of applications.

The PCS 90 includes two input terminals, P2 and Q2 (the voltage input terminals) as the connection points to the connection system 100. The input terminal P2 of the PCS 90 is connected to the resistor R and the fuse F included in the connection system 100. More specifically, the input terminal P2 of the PCS 90 is connected to the output terminal P1 of the EV 1 via the resistor R and the fuse F included in the connection system 100.

The input terminal Q2 of the PCS 90 is thus connected to the output terminal Q1 of the EV 1 without any impedance, such as a resistor.

Operation of Power System 1000

If the operation of the power system 1000 is analyzed in a simplified fashion, the fuse F is simply considered as an ideal fuse. In such a case, the operation time the fuse F takes before blocking the excessive current is zero. The fuse F is blown at the moment an excessive current flows therethrough, and the electric path is opened. The excessive current is instantaneously blocked.

Even if an excessive current flows into the relay circuit 11 from the battery 10, the excessive current is instantaneously blocked by the fuse F. The relay circuit 11 is not welded by the excessive current, and the relay circuit 11 does not lose the function thereof.

Case that Fuse is Non-Ideal

The case that the fuse is non-ideal is to be considered to study the operation of the power system 1000 more in detail. In such a case, the operation time the fuse F takes before blocking the excessive current is not zero. The excessive current is not blocked for a duration of time from (i) the moment the excessive current flows into the fuse F to (ii) the moment the fuse F is blown.

If an excessive current flows from the battery 10 into the relay circuit 11, a predetermined operation time is taken until the fuse F blocks the excessive current. The excessive current flowing into the relay circuit 11 for the predetermined operation time may cause the relay circuit 11 to be welded.

If the relay circuit 11 is welded, the relay circuit 11 loses the function thereof as a protection circuit. For a period of time subsequent to the welding of the relay circuit 11, the relay circuit 11 is unable to open the electric path between the output terminal P1 and the input terminal P2, and the electric path between the output terminal Q1 and the input terminal Q2.

Connection State Between EV 1 and PCS 90

Figure 2:
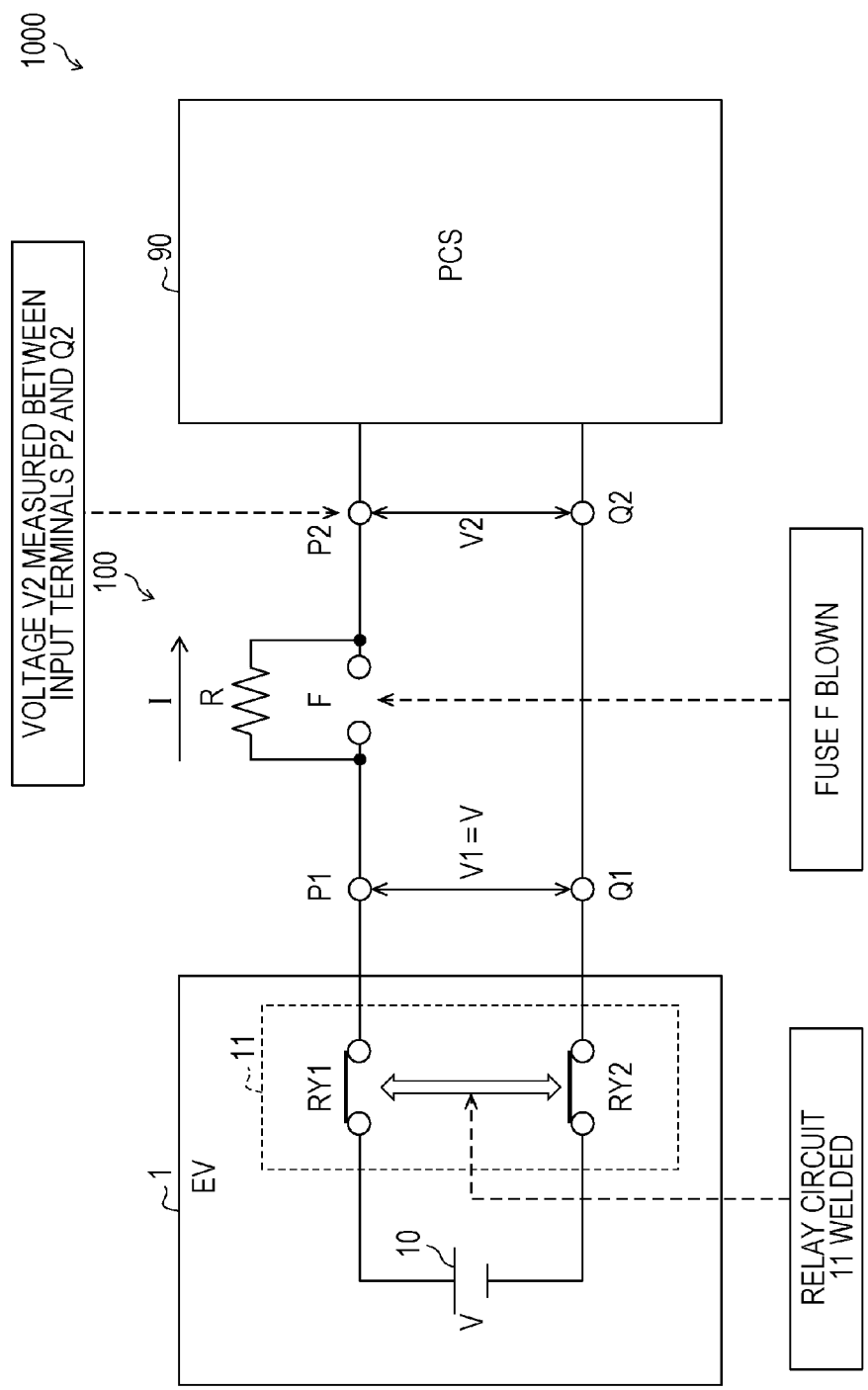
FIG. 2 illustrates an operation the power system performs if a fuse is blown and a relay circuit is welded in the power system of the first embodiment.

FIG. 2 illustrates the operation of the power system 1000 with the relay circuit 11 welded. With the relay circuit 11 welded, a voltage between the output terminals P1 and Q1 on the EV 1 is represented by V1, and a voltage between the input terminals P2 and Q2 is represented V2.

The connection state between the EV 1 and the PCS 90 connected to the EV 1 via the connection system 100 is described with reference to FIG. 2.

The output terminals P1 and Q1 of the EV 1 are connected to the battery 10. A relationship V1=V thus holds. The output terminal P1 of the EV 1 is connected to the input terminal P2 of the PCS 90 via the resistor R in the connection system 100.

Let I represent a current flowing into the resistor R, and a relationship I=(V1−V2)/R=(V−V2)/R holds. In other words, a relationship V2=V−R×I holds.

With the resistor R included in the power system 1000, the voltage V2 applied between the input terminals P2 and Q2 of the PCS 90 is lower than the voltage V of the battery 10.

Even if the relay circuit 11 is welded, an over voltage is not applied between the input terminals P2 and Q2 of the PCS 90. The electric path is maintained via the resistor R between the output terminal P1 and the input terminal P2 if the fuse F is blown. The voltage V2 between the input terminals P2 and Q2 of the PCS 90 is measured. Power system 1000c as a comparison example A power system 1000c as a comparison example of the power system 1000 of the first embodiment is described with reference to FIG. 15 and FIG. 16. The power system 1000c is described as the comparison example to discuss the effect of the power system 1000 of the first embodiment.

Figure 15:
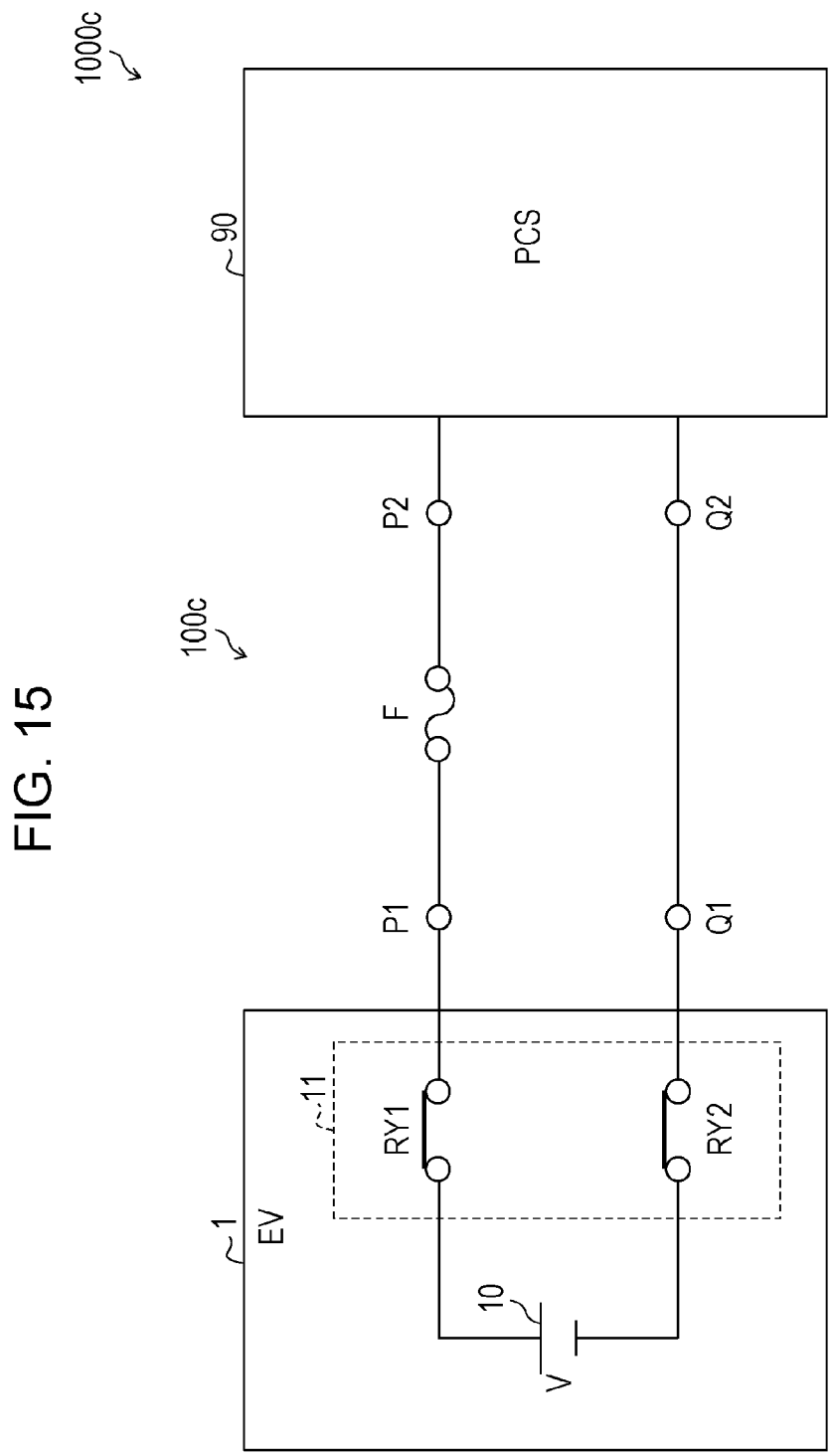
FIG. 15 illustrates the configuration of the power system as a comparison example to the first embodiment of the disclosure.

FIG. 15 illustrates the configuration of the power system 1000c as the comparison example. The power system 1000c includes EV 1, PCS 90, and connection system 100c. More specifically, the power system 1000c is configured by replacing the connection system 100 with the connection system 100c in the power system 1000.

The connection system 100c includes only the fuse F. More specifically, the connection system 100c is configured by removing the resistor R, connected in parallel with the fuse F, in the connection system 100.

Operation of Power System 1000c as a Comparison Example

Figure 16:
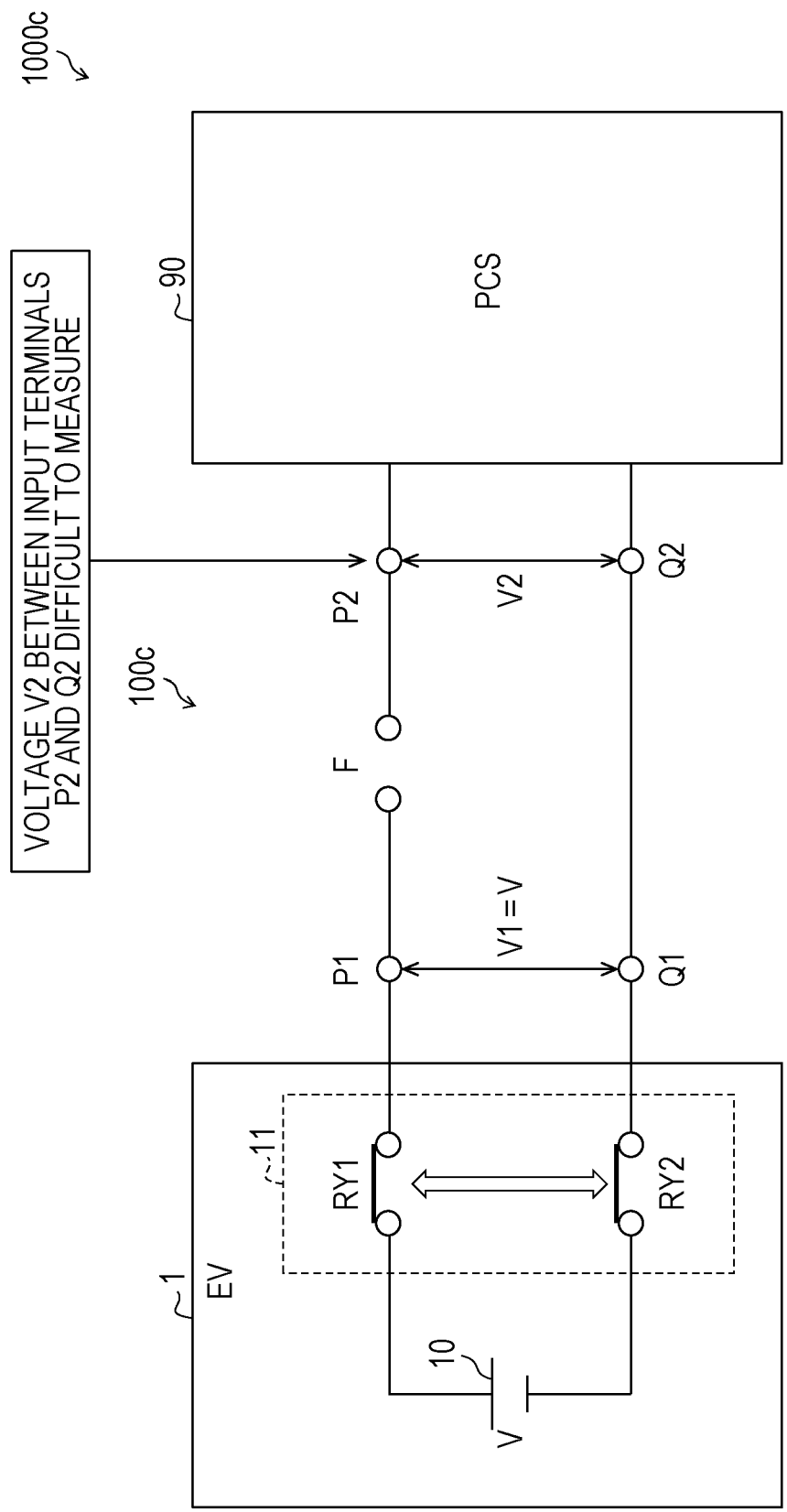
FIG. 16 illustrates an operation the power system performs if a fuse is blown, a relay circuit is welded, and input terminals are short-circuited in the power system as the comparison example to the first embodiment.

FIG. 16 illustrates the operation of the power system 1000c with the fuse F blown and the relay circuit 11 welded. Since the connection system 100c includes only the fuse F in the power system 1000c, the electric path between the output terminal P1 and the input terminal P2 is opened after the fuse F is welded.

Since the input terminal P2 of the PCS 90 is floating with the fuse F blown, the voltage V2 between the input terminals P2 and Q2 of the PCS 90 is difficult to measure.

Effect of Power System 1000

The power system 1000 of the first embodiment includes the connection system 100 having the resistor R and the fuse F connected in parallel with each other. Even if the fuse F is blown, the electric path is maintained between the output terminal P1 of the EV 1 and the input terminal P2 of the PCS 90. The voltage V2 between the input terminals P2 and Q2 of the PCS 90 remains measurable.

The connection system 100 in the power system 1000 includes the resistor R. Even if the relay circuit 11 is welded, the resistor R controls the application of an over voltage between the input terminals P2 and Q2 of the PCS 90.

The power system 1000 thus allows the voltage between the input terminals P2 and Q2 of the PCS 90 to be measured safely and accurately even if the fuse F is blown and the relay circuit 11 is welded.

In the power system 1000c, the voltage V2 between the input terminals P2 and Q2 of the PCS 90 is difficult to measure if the fuse F is blown. The power system 1000c suffers from the problem that the value of the voltage V2 between the input terminals P2 and Q2 of the PCS 90 is difficult to accurately measure even if the voltage V2 is a relatively higher with the relay circuit 11 welded and malfunctioning.

In other words, the power system 1000 with the resistor R arranged in the connection system 100 is free from the problem associated with the power system 1000c described as the comparison example.

The power system 1000 with the connection system 100 continuously maintains a circuit to measure the voltage between the input terminals P2 and Q2 even after the fuse F is blown. The power system 1000 of the first embodiment increases reliability in the power transmission between the EV 1 and the PCS 90.

The inventors have found out the technical issue that a circuit to measure the voltage between the input terminals P2 and Q2 is to be desirably maintained even after the fuse F is blown. It is not obvious to those skilled in the art to have an idea of the power system 1000 of the first embodiment, in particular, the configuration of the connection system 100, based on Japanese Unexamined Patent Application Publication No. 2013-74762.

Modification

The EV 1 is used as a power supply apparatus in the power system 1000 of the first embodiment. The power supply apparatus is not limited to an electric vehicle. A plug-in hybrid vehicle or a fuel-cell vehicle may be used as the power supply apparatus. The power supply target is not limited to these vehicles. The power supply target may be another power supply apparatus including a battery and a relay circuit (such as an electricity self-generation apparatus).

The power system 1000 of the first embodiment includes the PCS 90 as a load apparatus. The load apparatus is not limited to the power conditioner. The load apparatus may be another electric apparatus that receive power from the power supply apparatus.

Second Embodiment

A second embodiment of the disclosure is described with reference to FIG. 3 and FIG. 4 as described below. For convenience of explanation, elements identical to those described in the first embodiment are designated with the same reference numerals and the discussion thereof is omitted herein.

Configuration of Power System 2000

Figure 3:
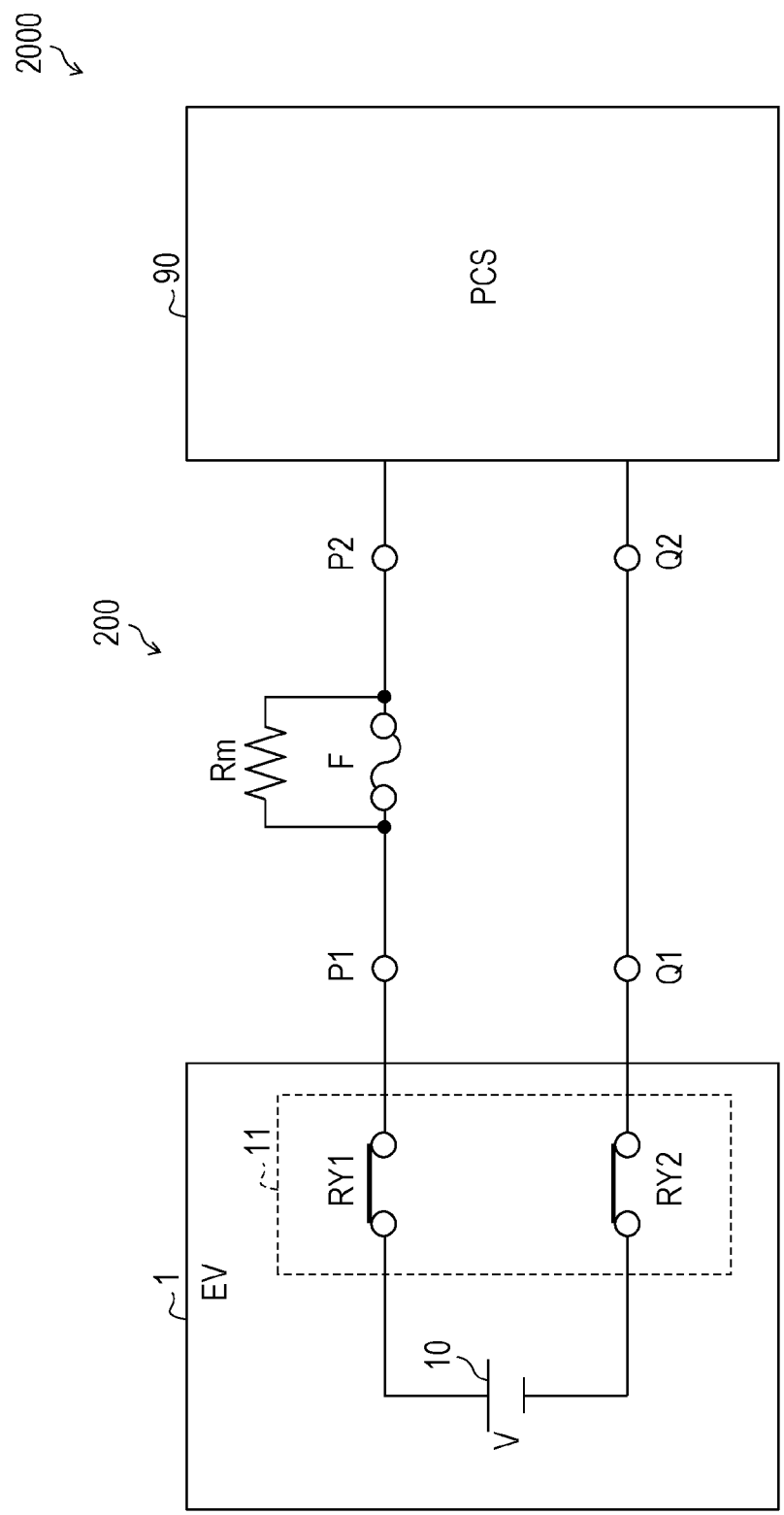
FIG. 3 illustrates a configuration of a power system of a second embodiment of the disclosure.

FIG. 3 illustrates a power system 2000 of the second embodiment. The power system 2000 includes EV 1, PCS 90, and connection system 200. More specifically, the power system 2000 is configured by replacing the connection system 100 in the power system 1000 with the connection system 200.

Connection System 200

The connection system 200 of the second embodiment is configured by replacing the resistor R in the connection system 100 of the first embodiment with a resistor Rm.

The resistor Rm is arranged to control a current flowing through the electric path between the output terminal P1 and the input terminal P2 to a predetermined value or lower (for example, 25 mA or lower) if the fuse F is blown and the relay circuit 11 is welded. The selection of the value of the resistor Rm is described below with reference to FIG. 4.

Operation of Power System 2000

Figure 4:
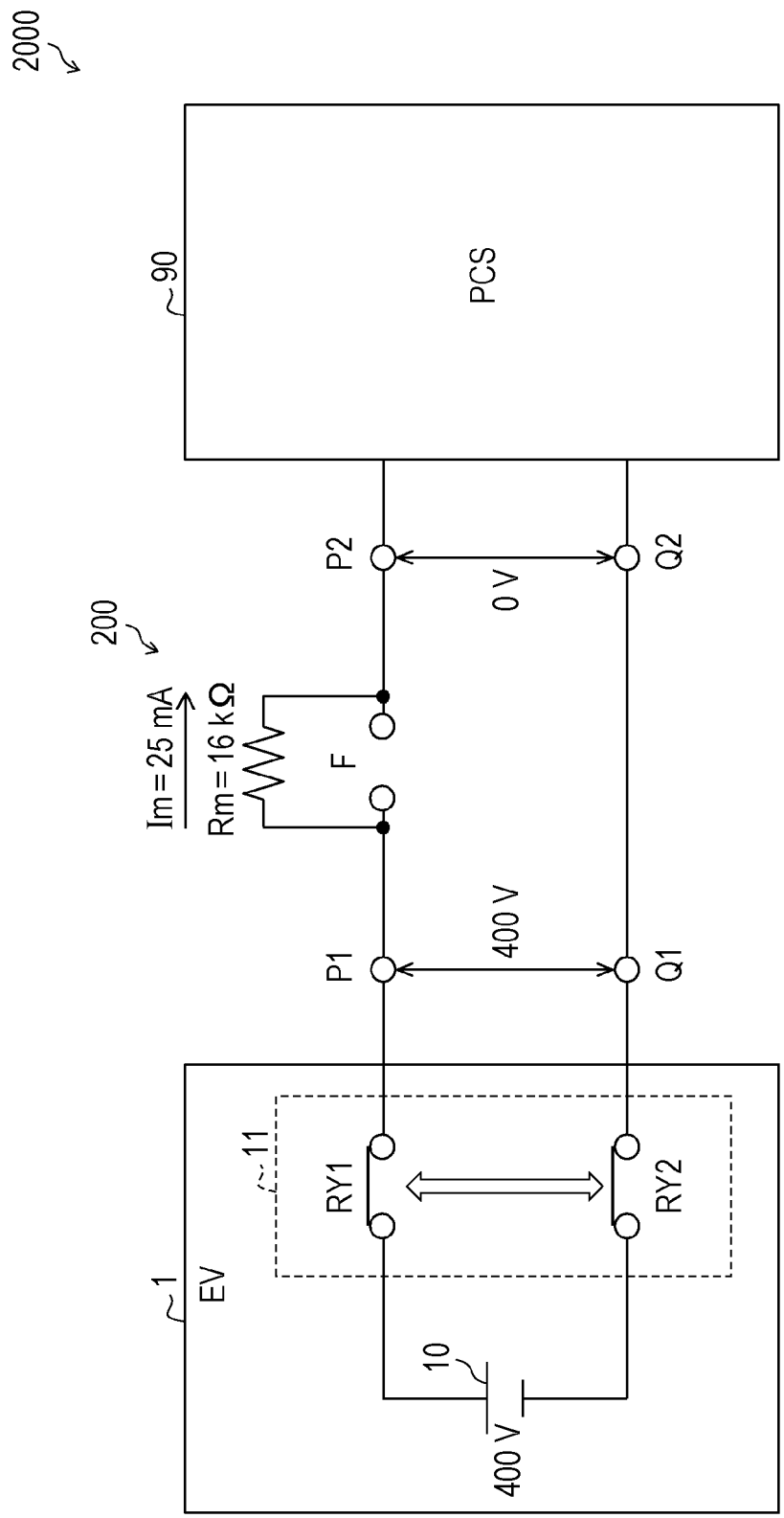
FIG. 4 illustrates an operation the power system performs if a fuse is blown and a relay circuit is welded in the power system of the second embodiment.

FIG. 4 illustrates the operation of the power system 2000 with the fuse F blown and the relay circuit 11 welded.

Let Im represent a current flowing through the resistor Rm, and a relationship Im=(V−V2)/Rm or Rm=(V−V2)/Im holds.

Given that the value of V is fixed, Im is maximized with V2=0 V. If the value of the resistor Rm is selected in the relationship Rm=V/Im, the value of the current Im flowing through the resistor Rm (namely, the current flowing through the electric path between the output terminal P1 and the input terminal P2) is reduced to a predetermined value or lower.

The voltage V of the battery 10 may now be 400 V in the power system 2000 of FIG. 4, and thus V1=V=400 V. In order to set the current Im flowing through the electric path between the output terminal P1 and the input terminal P2 to be Im≤25 mA, the value of the resistor Rm is determined to satisfy a relationship Rm≥400 V/25 mA=16 kΩ. For example, Rm=20 kΩ is selected to set Im=20 mA.

Effect of Power System 2000

If the fuse F is blown and the relay circuit 11 is welded in the power system 2000 of the second embodiment, the current Im flowing through the electric path between the output terminal P1 and the input terminal P2 is set to be a predetermined value or lower by selecting an appropriate value for the resistor Rm of the connection system 200.

Safety of the user who measures the voltage between the input terminals P2 and Q2 of the PCS 90 is even more increased.

The upper limit value of the current Im flowing through the electric path between the output terminal P1 and the input terminal P2 may be appropriately determined based on the operation condition of the power system 2000. The upper limit value of the current Im may be the upper limit value of the currents regulated from the standpoint of safety in "Effects of current on human beings and livestock—Part 1", Technical Specification IEC/TS 60479-1 Ed. 4.0: 2005(b).

Figure 17:
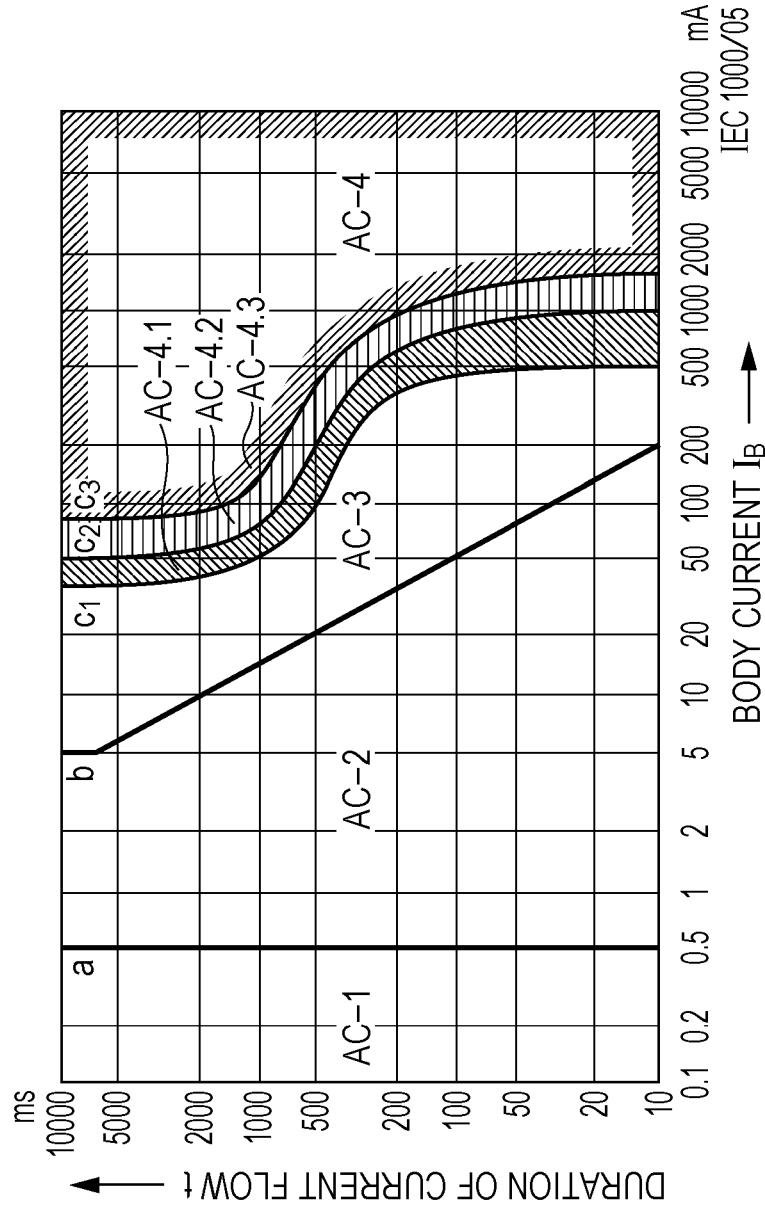
FIG. 17 corresponds to FIG. 20 cited from "Effects of current on human beings and livestock—Part 1", Technical Specification IEC/TS 60479-1 Ed. 4.0: 2005(b)

FIG. 17 corresponds to FIG. 20 cited from "Effects of current on human beings and livestock—Part 1", Technical Specification IEC/TS 60479-1 Ed. 4.0: 2005(b). A current of 5 mA is permitted to flow into the body of a human over 10 seconds or (10000 ms) or longer in a region AC-2 in FIG. 17.

Figure 18:
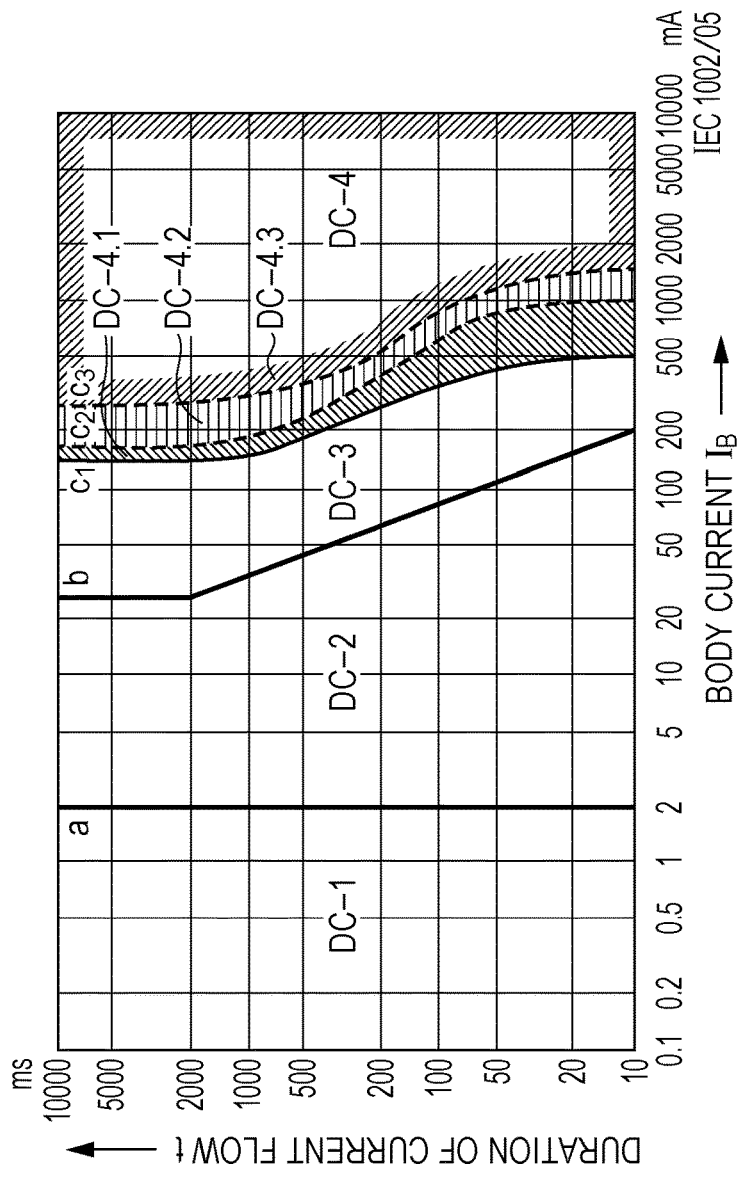
FIG. 18 corresponds to FIG. 22 cited from "Effects of current on human beings and livestock—Part 1", Technical Specification IEC/TS 60479-1 Ed. 4.0: 2005(b)

FIG. 18 corresponds to FIG. 22 cited from "Effects of current on human beings and livestock—Part 1", Technical Specification IEC/TS 60479-1 Ed. 4.0: 2005(b). A current of 25 mA is permitted to flow into the body of a human over 10 seconds or (10000 ms) or longer in a region DC-2 in FIG. 18.

FIG. 19 corresponds to FIG. 23 cited from "Effects of current on human beings and livestock—Part 1", Technical Specification IEC/TS 60479-1 Ed. 4.0: 2005(b). As illustrated in FIG. 19, (i) the value of the let-go current of 99 percent of the men is 10 mA, (ii) the value of the let-go current of 99 percent of the women is 7 mA, and (iii) the value of the leg-go current of 99 percent of the children is 5 mA.

Technical Specification IEC 60479-1 regulates, as the upper limit values of current, 25 mA, 10 mA, 7 mA, and 5 mA, for example, from the standpoint of safety.

In the power system 2000, the current Im may take one of Im=25 ma, Im=10 mA, Im=7 mA, and Im=5 mA. To this end, the resistor Rm may be selected to satisfy at least one of the following conditions Rm≥16 kΩ, Rm≥40 kΩ, Rm≥58 kΩ, and Rm≥80 kΩ in the power system 2000.

Third Embodiment

A third embodiment of the disclosure is described below with reference to FIG. 5. For convenience of explanation, elements identical to those described with reference to the preceding embodiments are designated with the same reference numerals and the discussion thereof is omitted herein.

Configuration of Power System 3000

Figure 5:
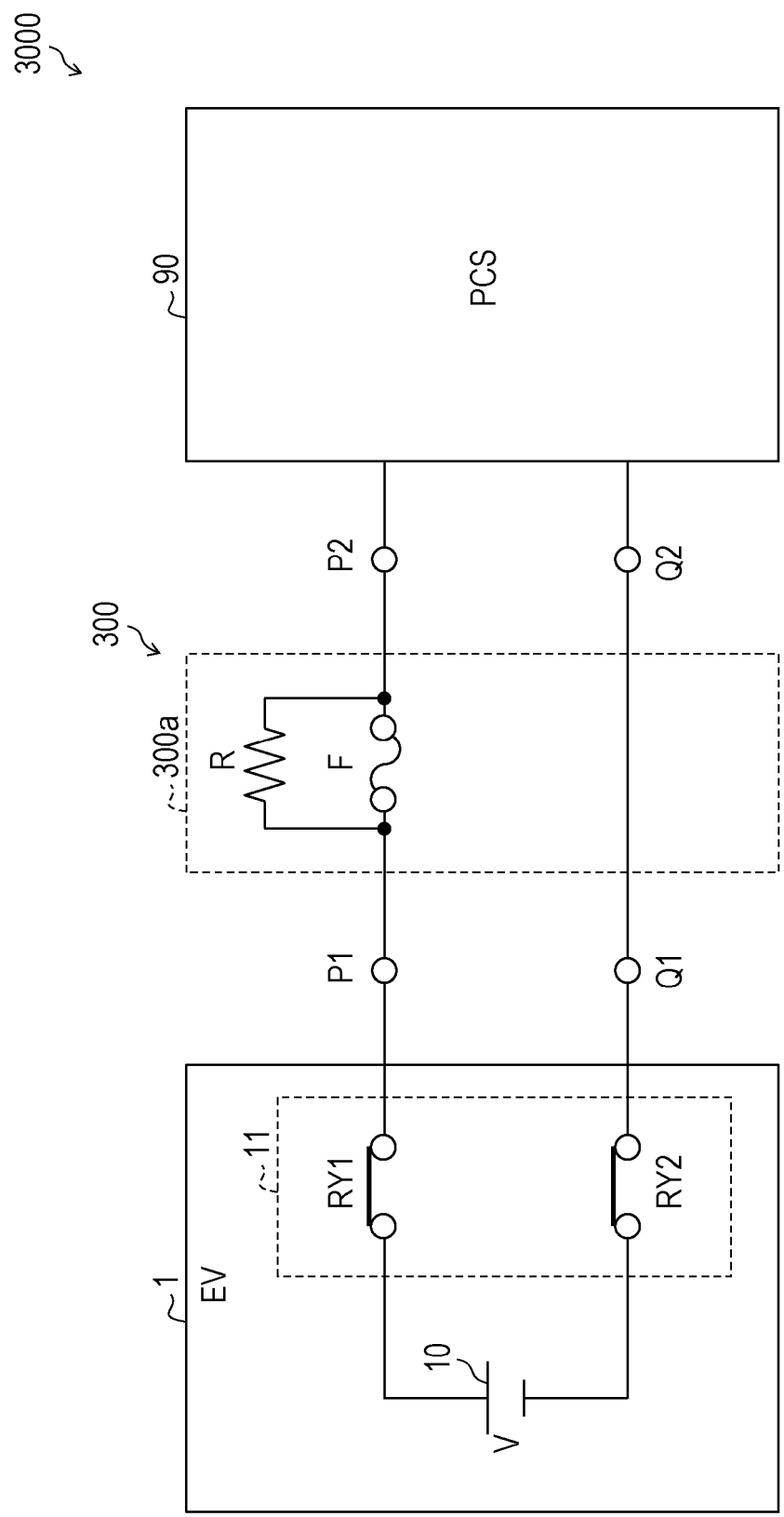
FIG. 5 illustrates the configuration of the power system of a third embodiment of the disclosure.

FIG. 5 illustrates a power system 3000 of the third embodiment. The power system 3000 includes EV 1, PCS 90, and connection system 300. The connection system 300 includes a connector 300a.

The power system 3000 of the third embodiment is configured by replacing the connection system 100 in the power system 1000 of the first embodiment with the connector 300a.

Connector 300a

The connector 300a is a connection tool that connects the EV 1 to the PCS 90, and may be a direct-current (DC) power connector.

As the connection system 100 of the first embodiment, the connector 300a of the third embodiment includes the fuse F and the resistor R connected in parallel with the fuse F. The power system 3000 is thus configured by replacing the connection system 100 of the first embodiment with the connector 300a.

In the power system 3000, the fuse F and the resistor R are arranged within the connector 300a.

Effect of Power System 3000

In the power system 3000, the connection system 100 of the first embodiment is implemented by the connector 300a. The connection system to connect the EV 1 to the PCS 90 is thus easily implemented.

The power system 3000 of the third embodiment with the connector 300a therewithin facilitates the user's job to connect the EV 1 to the PCS 90 and to disconnect the EV 1 from the PCS 90.

The power system 3000 of the third embodiment with the connector 300a therewithin allows the voltage between the input terminals P2 and Q2 of the PCS 90 to be accurately and safely measured when the EV 1 is connected to the PCS 90.

Modification

In the power system 3000 of the third embodiment, the connector 300a includes the fuse F and the resistor R. However, the fuse F and the resistor R do not necessarily have to be mounted within the connector that connects the EV 1 to the PCS 90.

Figure 6:
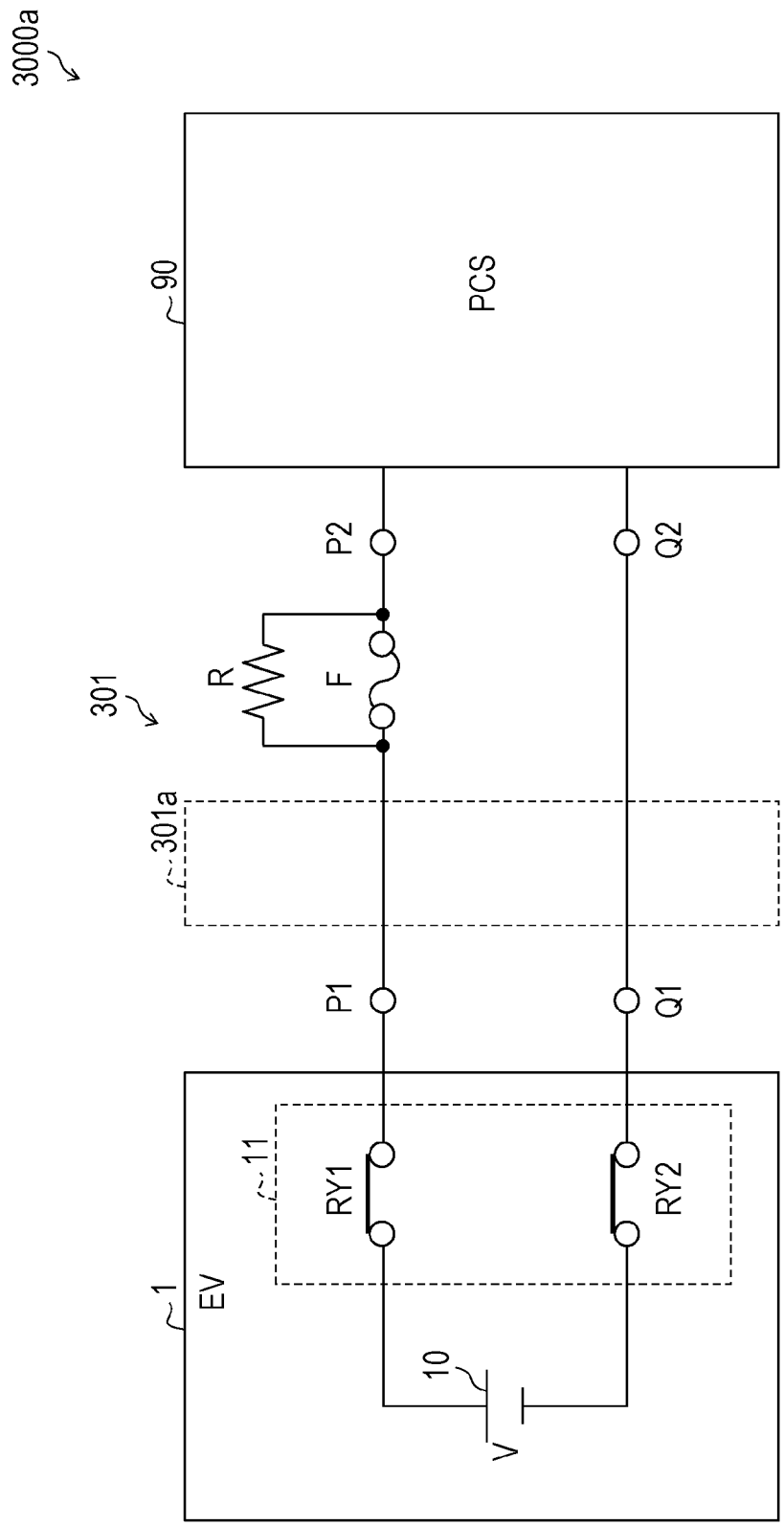
FIG. 6 illustrates the configuration of the power system as a modification of the third embodiment of the disclosure.

FIG. 6 illustrates the configuration of a power system 3000a as a modification of the power system 3000 of the third embodiment. The power system 3000a includes EV 1, PCS 90, and connection system 301.

The connection system 301 includes connector 301a, fuse F, and resistor R. In the connection system 301, the fuse F and the resistor R are external to the connector 301a. More specifically, the fuse F and the resistor R are arranged closer to the PCS 90. The connector 301a is arranged closer to the EV 1.

The power system 3000a is identical in electrical circuit configuration to the power system 3000 of the third embodiment, and provides the same effect as the power system 3000 of the third embodiment.

The power system 3000a indicates that a configuration of the connector 301a not having the fuse F and the resistor R therein still allows the voltage between the input terminals P2 and Q2 of the PCS 90 to be accurately and safely measured.

In the power system 3000a, the connector 301a and the fuse F are desirably connected to each other as close as possible in order to provide protection by short-circuit.

Fourth Embodiment

A fourth embodiment of the disclosure is described with reference to FIG. 7 and FIG. 8. For convenience of explanation, elements identical to those described in the preceding embodiments are designated with the same reference numerals, and the discussion thereof is omitted herein.

Configuration of Power System 4000

Figure 7:
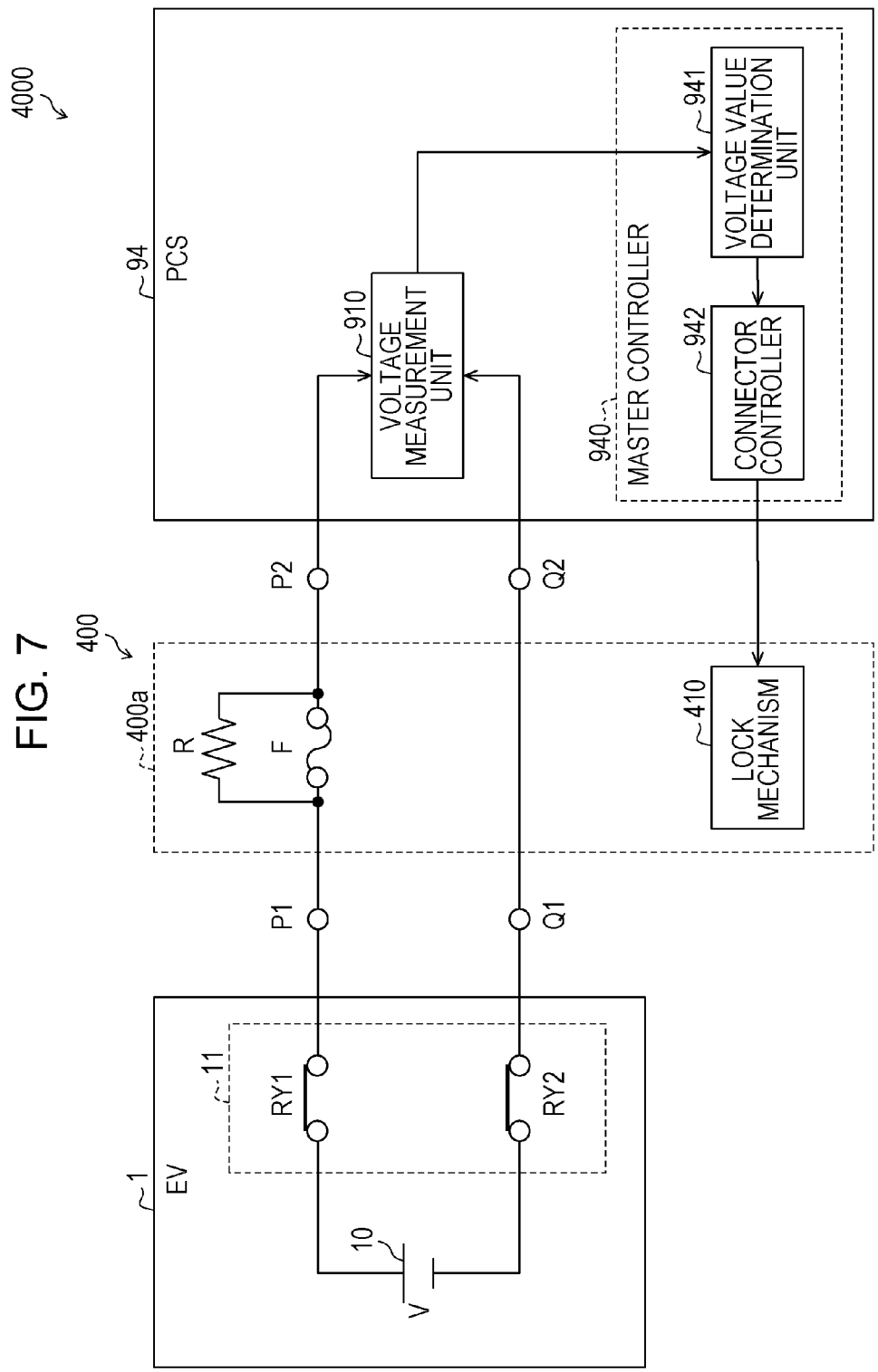
FIG. 7 illustrates the configuration of the power system of a fourth embodiment of the disclosure.

FIG. 7 illustrates the configuration of a power system 4000. The power system 4000 includes EV 1, PCS 94, and connection system 400. The connection system 400 includes a connector 400a, and a master controller 940. The master controller 940 of the connection system 400 is arranged in the PCS 94.

The power system 4000 is configured by (i) replacing the connector 300a with the connector 400a and (ii) replacing the PCS 90 with the PCS 94 in the power system 3000.

Connector 400a

The connector 400a is configured by adding a lock mechanism 410 to the connector 300a of the third embodiment. The lock mechanism 410 locks the connector 400a in a connection state between the EV 1 and the PCS 94 so that the connector 400a is not disconnected between the EV 1 and the PCS 94.

The state that the connector 400a is locked in connection between the EV 1 and the PCS 94 is referred to as a lock state. An operation of the connector 400a to lock the connection between the EV 1 and the PCS 94 is referred to as a locking operation.

The locking operation of the lock mechanism 410 is controlled by a connector controller 942 included in the PCS 94. The control operation of the lock mechanism 410 under the control of the connector controller 942 is described below.

PCS 94

The PCS 94 is configured by adding a voltage measurement unit 910 to the PCS 90 of the first through third embodiment. The master controller 940 is arranged in the PCS 94.

The voltage measurement unit 910 is connected to the input terminal P2 and the input terminal Q2 of the PCS 94. The voltage measurement unit 910 has a function of measuring the value of the voltage V2 between the input terminals P2 and Q2 of the PCS 94. The voltage measurement unit 910 is a voltmeter or a digital multimeter.

The master controller 940 generally controls the operation of a variety of hardware elements (such as a state monitoring unit (not illustrated)) included in the PCS 94, and the function of the PCS 94. The master controller 940 also functions as a voltage value determination unit 941 and a connector controller 942 discussed below.

Figure 8:
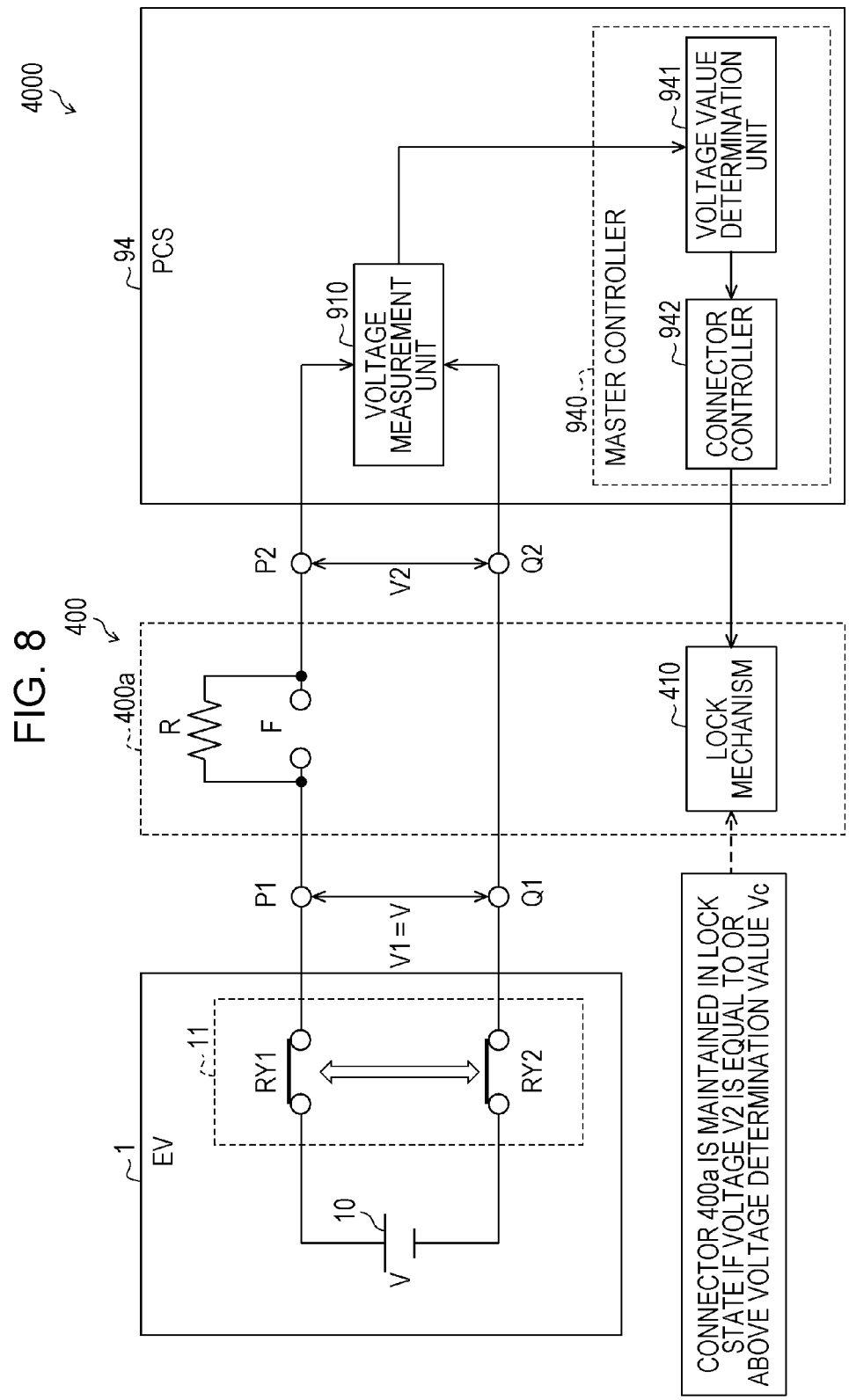
FIG. 8 illustrates an operation the power system performs if a fuse is blown and a relay circuit is welded in the power system of the fourth embodiment.

FIG. 8 illustrates the operation of the power system 4000 with the fuse F blown and the relay circuit 11 welded. Referring to FIG. 8, the functions of the voltage value determination unit 941 and the connector controller 942 are described.

The voltage value determination unit 941 acquires the value of the voltage V2 from the voltage measurement unit 910. The voltage value determination unit 941 determines whether the value of the voltage V2 is equal to or above a predetermined voltage determination value Vc (for example, 60 V), and generates voltage determination result information indicating the determination results. The voltage value determination unit 941 transfers the voltage determination result information to the connector controller 942 (a voltage value determination operation).

The connector controller 942 generates a first lock signal based on the voltage determination result information transferred from the voltage value determination unit 941. More specifically, the connector controller 942 generates the first lock signal as a control signal. The first lock signal is used so that the lock mechanism 410 maintains the lock state in the connector 400a if the voltage determination result information indicating that the value of the voltage V2 is equal to or higher than the voltage determination value Vc is generated.

The connector controller 942 transfers the first lock signal to the lock mechanism 410 (a first control operation). If the value of the voltage V2 is equal to or higher than the voltage determination value Vc, the lock mechanism 410 maintains the lock state in the connector 400a in accordance with the first lock signal.

The connector controller 942 does not generates the first lock signal if the voltage determination result information indicating that the value of the voltage V2 is below the voltage determination value Vc is generated. In such a case, the user disconnects the connector 400a to open the connection between the EV 1 and the PCS 94.

Effect of Power System 4000

The connection system 400 of the fourth embodiment maintains the lock state in the connector 400a using the lock mechanism 410 if the value of the voltage V2 between the input terminals P2 and Q2 of the PCS 94 measured by the voltage measurement unit 910 is equal to or above the voltage determination value Vc.

If the value of the voltage V2 between the input terminals P2 and Q2 of the PCS 94 measured by the voltage measurement unit 910 is equal to or above the voltage determination value Vc, the connector 400a is in the lock state. Even if the user attempts to disconnect the connector 400a, the connector 400a remains locked.

The power system 4000 of the fourth embodiment provides the effect that the safety of the user operating the connector 400a is ensured even if a voltage equal to or above a predetermined value is applied between the input terminals P2 and Q2 with the fuse F blown and the relay circuit 11 welded.

Modification

In the power system 4000 of the fourth embodiment, the voltage measurement unit 910 and the master controller 940 are arranged in the PCS 94. The voltage measurement unit 910 and the master controller 940 does not necessarily have to be arranged in the PCS 94.

Only the voltage measurement unit 910 may be arranged in the PCS 94 and the master controller 940 may be arranged external to the PCS 94. Alternatively, only the master controller 940 may be arranged in the PCS 94, and the voltage measurement unit 910 may be arranged external to the PCS 94. Both the voltage measurement unit 910 and the master controller 940 may be arranged external to the PCS 94.

The power system 4000 works as long as the master controller 940 is included in the connection system 400.

Fifth Embodiment

A fifth embodiment of the disclosure is described below with reference to FIG. 9 through FIG. 11. For convenience of explanation, elements identical to those in the preceding embodiments are designated with the same reference numerals, and the discussion thereof is omitted herein.

Configuration of Power System 5000

Figure 9:
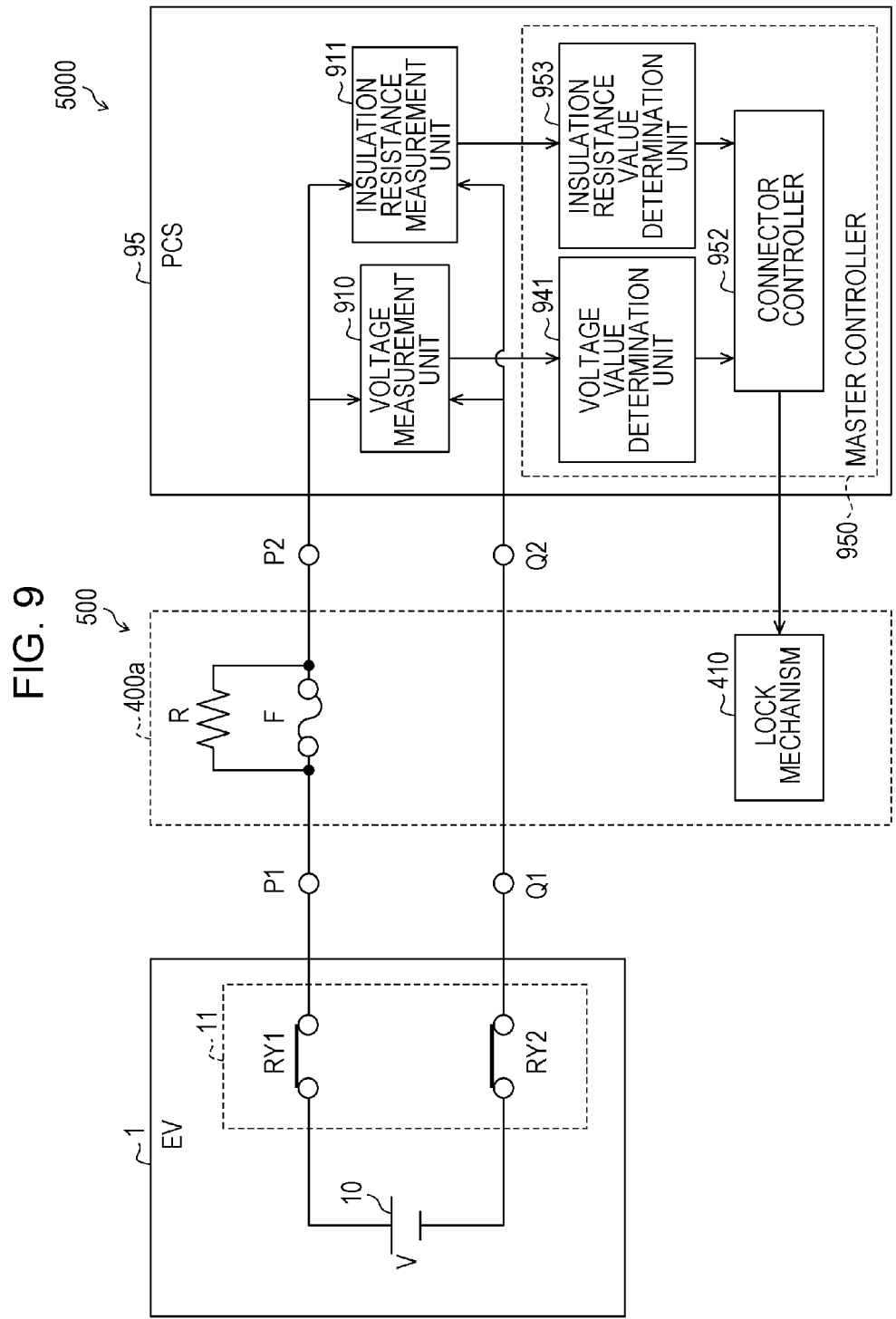
FIG. 9 illustrates the configuration of the power system of a fifth embodiment of the disclosure.

FIG. 9 illustrates the configuration of a power system 5000 of the fifth embodiment. The power system 5000 includes EV 1, PCS 95, and connection system 500. The connection system 500 includes a connector 400a and a master controller 950. As in the fourth embodiment, the master controller 950 of the connection system 500 is arranged in the PCS 95 in the fifth embodiment.

The power system 5000 of the fifth embodiment is configured by replacing the PCS 94 in the power system 4000 of the fourth embodiment with the PCS 95.

PCS 95

The PCS 95 is configured by adding an insulation resistance measurement unit 911 to the PCS 94 of the fourth embodiment. The master controller 950 is arranged in the PCS 95.

The insulation resistance measurement unit 911 is connected to the input terminals P2 and Q2 of the PCS 95. The insulation resistance measurement unit 911 has the function of measuring an insulation resistance Ri between the input terminals P2 and Q2 of the PCS 95. The insulation resistance measurement unit 911 may be an insulation resistance meter or a digital multimeter.

The value of the insulation resistance Ri is sufficiently high (for example, as high as 10 MΩ) if the input terminals P2 and Q2 are not short-circuited. If the input terminals P2 and Q2 are not short-circuited by cable contact or some other reason, the value of the insulation resistance Ri becomes zero Ω.

To ensure electric insulation between the input terminals P2 and Q2, the insulation resistance measurement unit 911 desirably measures the insulation resistance Ri by applying between the input terminals P2 and Q2 a voltage higher than the voltage determination value Vc.

The master controller 950 is configured (i) by adding an insulation resistance value determination unit 953 and (ii) by replacing the connector controller 942 with a connector controller 952 in the master controller 940 of the fourth embodiment.

The master controller 950 thus has the functions of the insulation resistance value determination unit 953 and the connector controller 952 in addition to the function of the voltage value determination unit 941.

Case in which Input Terminals P2 and Q2 are Short-Circuited

Figure 10:
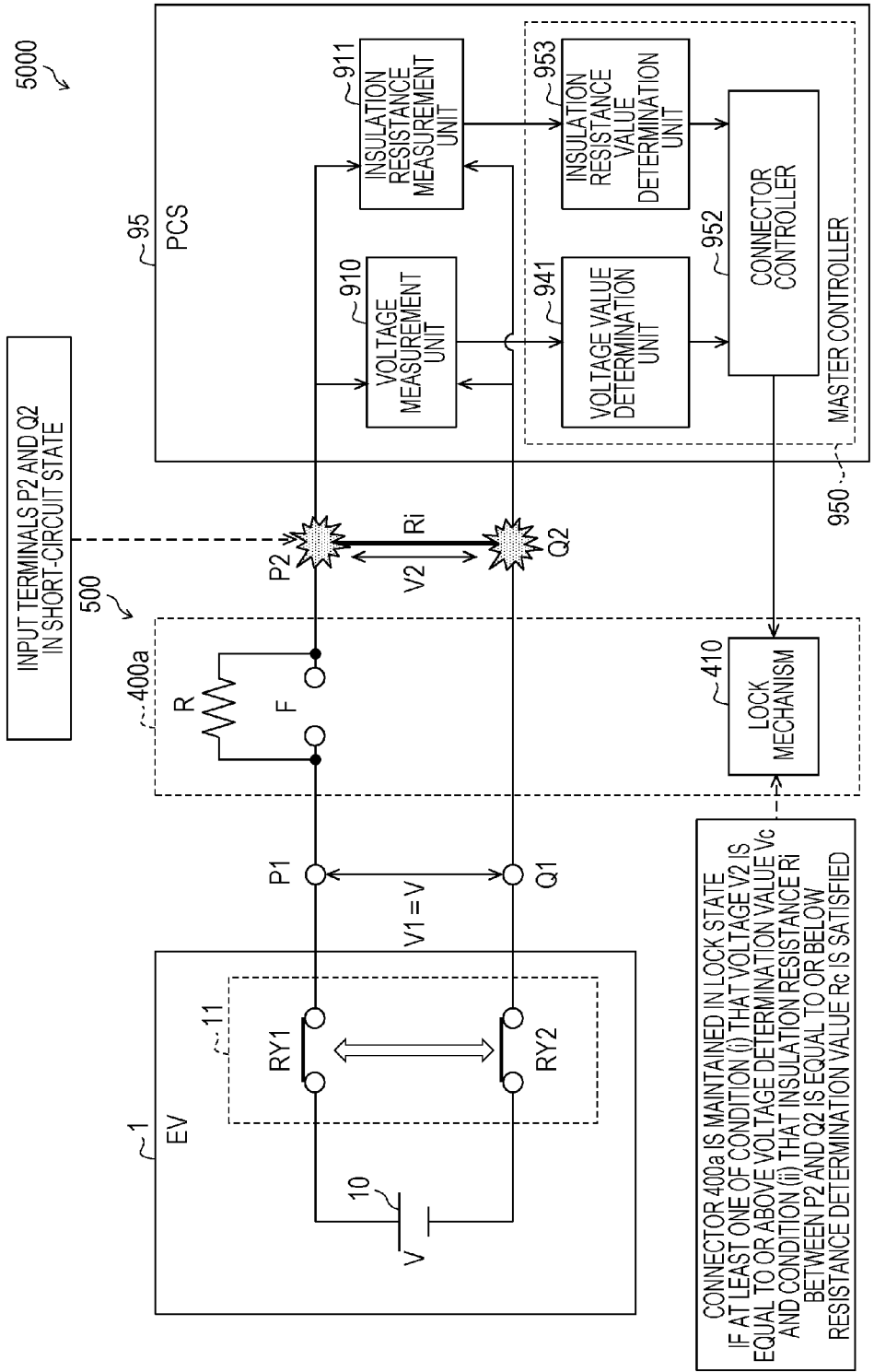
FIG. 10 illustrates an operation the power system performs if a fuse is blown, a relay circuit is welded, and input terminals are short-circuited in the power system of the fifth embodiment.

FIG. 10 illustrates the operation of the power system 5000 with the fuse F blown, the relay circuit 11 welded, and the input terminals P2 and Q2 short-circuited. The functions of the insulation resistance value determination unit 953 and the connector controller 952 are described below with reference to FIG. 10.

The insulation resistance value determination unit 953 acquires the value of the insulation resistance Ri from the insulation resistance measurement unit 911. The insulation resistance value determination unit 953 determines whether the value of the insulation resistance Ri is equal to or below a predetermined resistance determination value Rc (1 MΩ, for example), and then generates resistance determination result information indicating determination results. The insulation resistance value determination unit 953 transfers the resistance determination result information to the connector controller 952 (an insulation resistance value determination operation).

The connector controller 952 generates a second lock signal based on the resistance determination result information transferred from the insulation resistance value determination unit 953. More specifically, the connector controller 952 generates the second lock signal as a control signal. In response to the second lock signal, the lock mechanism 410 maintains the connector 400a in the lock state (namely, causes the connector 400a to continue to be in the lock state), in response to the resistance determination result information indicating that the value of the insulation resistance Ri is equal to or below the resistance determination value Rc.

The connector controller 952 does not generate the second lock signal in response to the resistance determination result information indicating that the value of the insulation resistance Ri is above the resistance determination value Rc.

The connector controller 952 transfers the generated second lock signal to the lock mechanism 410 (a second lock control operation). If the value of the insulation resistance Ri is equal to or below the resistance determination value Rc, the lock mechanism 410 maintains the connector 400a in the lock state in response to the second lock signal.

As the connector controller 942 of the fourth embodiment, the connector controller 952 generates the first lock signal in response to the voltage determination result information transferred from the voltage value determination unit 941. If the value of the voltage V2 is equal to or above the voltage determination value Vc, the lock mechanism 410 maintains the connector 400a in the lock state in response to the first lock signal in the same manner as in the fourth embodiment.

The lock mechanism 410 maintains the connector 400a in the lock state if at least one of (i) the condition that the value of the voltage V2 is equal to or above the voltage determination value Vc and (ii) the condition that the value of the insulation resistance Ri is equal to or below the resistance determination value Rc is satisfied.

Case in which Input Terminals P2 and Q2 are not Short-Circuited

Figure 11:
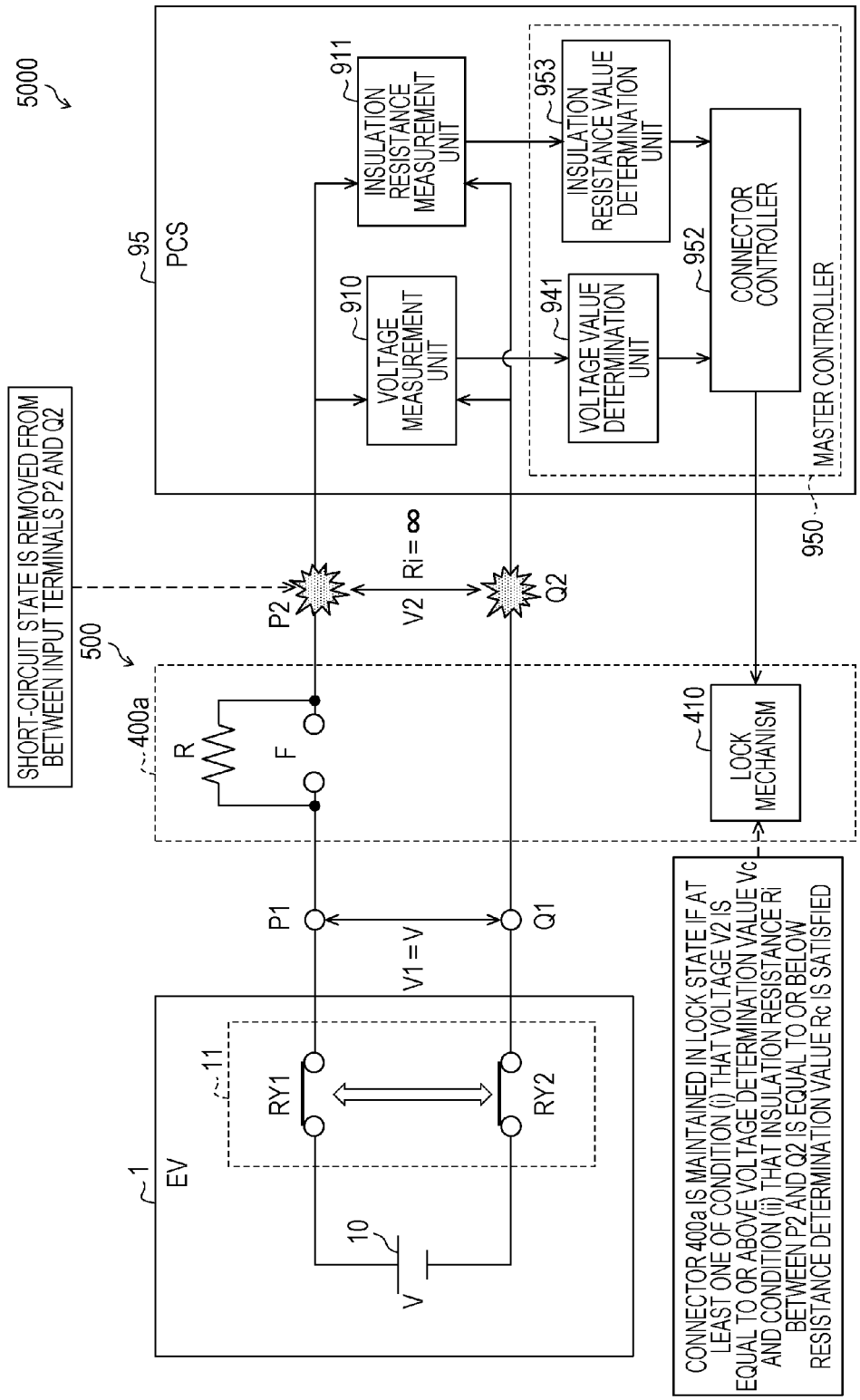
FIG. 11 illustrates an operation the power system performs if the fuse is blown, the relay circuit is welded, and the input terminals are not short-circuited in the power system of the fifth embodiment.

FIG. 11 illustrates the operation of the power system 5000 with the fuse F blown, the relay circuit 11 welded, and the input terminals P2 and Q2 not short-circuited.

Since the input terminals P2 and Q2 are not short-circuited, the value of the insulation resistance Ri is Ri=∞. The connector controller 952 does not generate the second lock signal. The operation of the lock mechanism 410 is controlled only by the first lock signal transferred from the connector controller 942, in the same way as in the fourth embodiment.

Effect of the Power System 5000

If at least one of (i) the condition that the value of the voltage V2 is equal to or above the voltage determination value Vc or (ii) the condition that the value of the insulation resistance Ri is equal to or below the resistance determination value Rc is satisfied in the power system 5000 of the fifth embodiment, the lock mechanism 410 maintains the connector 400a in the lock state.

If the input terminals P2 and Q2 are short-circuited, and the voltage V2 between the input terminals P2 and Q2 is equal to or below the voltage determination value Vc, the value of the insulation resistance Ri is determined to verify the insulation between the input terminals P2 and Q2. The connector 400a remains connected unless the insulation between the input terminals P2 and Q2 is verified.

The power system 5000 of the fifth embodiment provides the effect that the safety of the user operating the connector 400a is ensured when the input terminals P2 and Q2 are short-circuited and the voltage V2 between the input terminals P2 and Q2 is measured as a lower value.

There is no particular order set in the sequence of the determination operation of the insulation resistance value determination unit 953 to determine the value of the insulation resistance Ri and the determination operation of the voltage value determination unit 941 to determine the value of the voltage V2.

However, if the input terminals P2 and Q2 are not short-circuited, the resistance determination result information generated in the insulation resistance value determination unit 953 is not used in the connector controller 952. For efficiency of the operation of the master controller 950, the determination operation of the insulation resistance value determination unit 953 to determine the value of the insulation resistance Ri is desirably performed prior to the determination operation of the voltage value determination unit 941 to determine the value of the voltage V2.

The master controller 950 desirably starts the determination operation of the insulation resistance value determination unit 953 only when the voltage value determination unit 941 determines that the value of the voltage V2 is equal to or below the voltage determination value Vc. In such a case, the voltage determination result information generated by the voltage value determination unit 941 may serve as a trigger starting up the determination operation of the insulation resistance value determination unit 953.

Modification

In the same way as in the power system 4000 of the fourth embodiment, the voltage measurement unit 910, the insulation resistance measurement unit 911, and the master controller 950 do not necessarily have to be arranged in the PCS 95 in the power system 5000 of the fifth embodiment. The power system 5000 works as long as the master controller 950 is included in the connection system 500.

Sixth Embodiment

A sixth embodiment of the disclosure is described below with reference to FIG. 12 and FIG. 13. For convenience of explanation, elements identical to those described in the preceding embodiments are designated with the same reference numerals and the discussion thereof is omitted herein.

Configuration of Power System 6000

Figure 12:
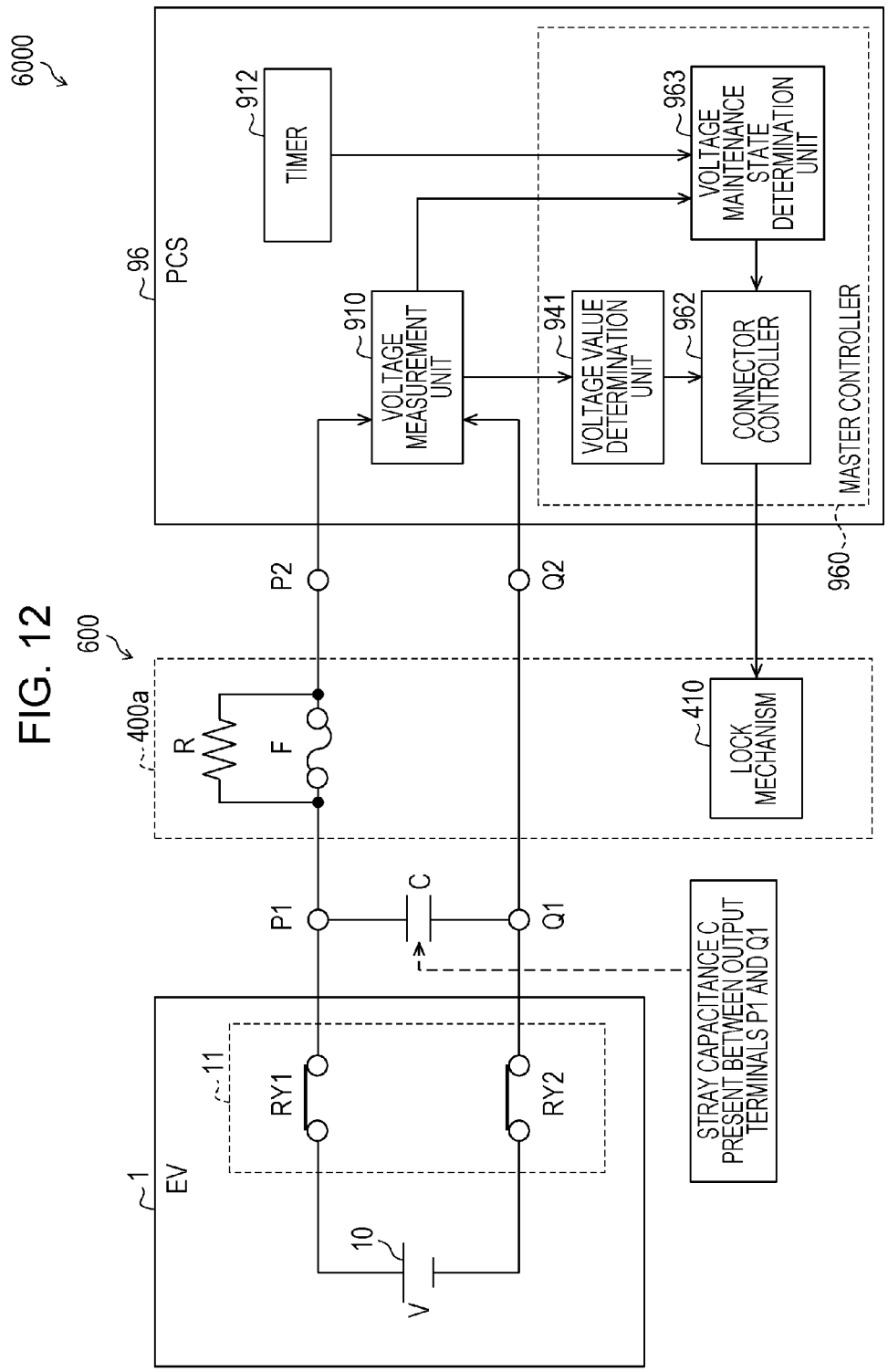
FIG. 12 illustrates the configuration of the power system of a sixth embodiment of the disclosure.

FIG. 12 illustrates the configuration of a power system 6000 of the sixth embodiment. The power system 6000 includes EV 1, PCS 96, and connection system 600. The connection system 600 includes connector 400a, and master controller 960. In the same way as in the fourth embodiment, the master controller 960 of the connection system 600 is arranged in the PCS 96.

A stray capacitance C is present between the output terminals P1 and Q1 of the EV 1 in the power system 6000. The power system 6000 of the sixth embodiment is configured by (i) replacing the PCS 94 with the PCS 96 and by (ii) adding the stray capacitance C between the output terminals P1 and Q1 of the EV 1 in the power system 4000 of the fourth embodiment.

The power system 6000 is thus intended to ensure the safety of the user operating the connector 400a even with the stray capacitance C present between the output terminals P1 and Q1.

Stray Capacitance C

The stray capacitance C is created between the output terminals P1 and Q1 of the EV 1 when cables are closely arranged in the power system 6000.

When the relay circuit 11 is closed, the battery 10 supplies a voltage V to the stray capacitance C. With charge accumulated in the stray capacitance C, the stray capacitance C maintains a voltage V1=V in a steady state.

When the relay circuit 11 operates, opening the electric path, the voltage V from the battery 10 is not supplied to the stray capacitance C. The stray capacitance C discharges with time, and the voltage V1 between the output terminals P1 and Q1 (namely, the voltage stored by the stray capacitance C) gradually falls.

If the relay circuit 11 appropriately operates, the effect of the stray capacitance C is gradually decreased with time.

The voltage V2 between the input terminals P2 and Q2 of the PCS 95 is not affected by the stray capacitance C in practice.

However, if the relay circuit 11 is welded, the voltage V is continuously supplied from the battery 10 to the stray capacitance C. Even after a sufficiently long period of time has elapsed, the voltage V1 between the output terminals P1 and Q1 is maintained. The voltage V2 between the input terminals P2 and Q2 of the PCS 95 is affected by the stray capacitance C.

PCS 96

The PCS 96 is configured by adding a timer 912 to the PCS 94 of the fourth embodiment. The master controller 960 is arranged in the PCS 96.

The timer 912 has the function of measuring the present time. For example, a clock circuit in the master controller 960 may be used for the timer 912. The present time measured by the timer 912 is transferred to a voltage maintenance state determination unit 963 in the master controller 960.

The master controller 960 is configured by (i) adding the voltage maintenance state determination unit 963 and (ii) replacing the connector controller 942 in the master controller 940 of the fourth embodiment with a connector controller 962.

The master controller 960 has the functions of the voltage maintenance state determination unit 963 and the connector controller 952 in addition to the function of the voltage value determination unit 941.

Case in which Input Terminals P2 and Q2 are Short-Circuited

Figure 13:
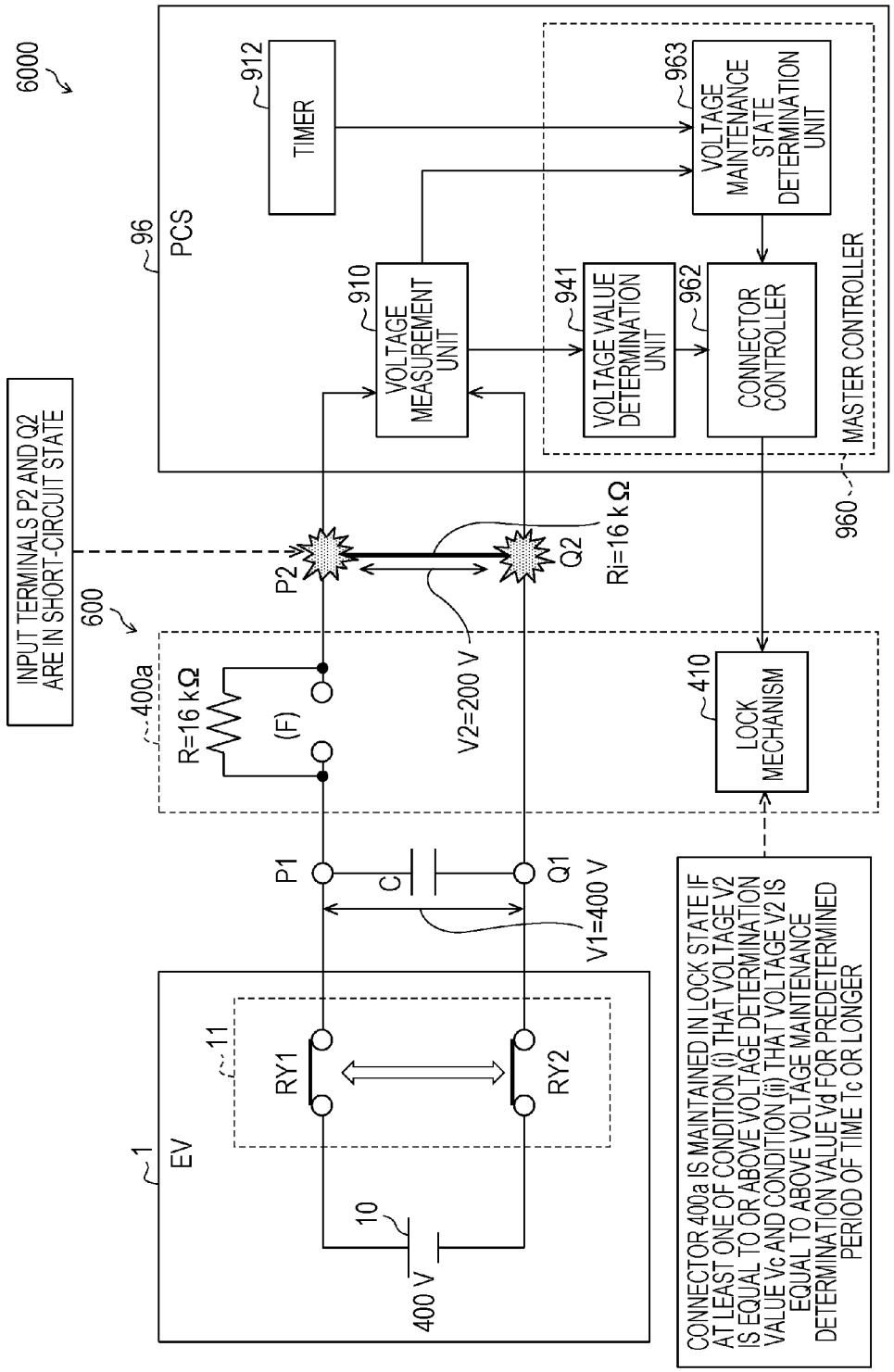
FIG. 13 illustrates an operation the power system performs if a fuse is blown, a relay circuit is welded, and input terminals are short-circuited in the power system of the sixth embodiment.

FIG. 13 illustrates the operation of the power system 6000 with the fuse F blown, the relay circuit 11 welded, and the input terminals P2 and Q2 short-circuited. Referring to FIG. 13, the functions of the voltage maintenance state determination unit 963 and the connector controller 962 is described below.

The voltage maintenance state determination unit 963 acquires the present time from the timer 912 and the value of the voltage V2 at the present time from the voltage measurement unit 910. The voltage maintenance state determination unit 963 generates a voltage time chart indicating the value of the voltage V2 at each instant. The voltage time chart is information that indicates the voltage V2 changing with time.

The voltage maintenance state determination unit 963 references the voltage time chart, and determines whether the value of the voltage V2 remains equal to or above a voltage maintenance determination value Vd (50 V, for example) for a predetermined period of time (10 seconds, for example). The voltage maintenance state determination unit 963 generates voltage maintenance determination result information indicating the determination results, and transfers the voltage maintenance determination result information to the connector controller 952.

The voltage maintenance determination value Vd is set to be a value lower than the voltage determination value Vc in the voltage maintenance state determination unit 963.

The connector controller 962 generates a third lock signal in response to the voltage maintenance determination result information transferred from the voltage maintenance state determination unit 963. More specifically, the connector controller 962 generates the third lock signal as a control signal in response to the voltage maintenance determination result information (a voltage maintenance state determination operation). The third lock signal is used so that the lock mechanism 410 maintains the lock state in the connector 400a (to continue the locking operation) in response to the voltage maintenance determination result information that indicates that the value of the voltage V2 remains equal to or above the voltage maintenance determination value Vd for the period of time of Tc or longer.

The connector controller 962 does not generate the third lock signal if the connector controller 962 is supplied with the resistance determination result information indicating that the value of the voltage V2 remains below the voltage maintenance determination value Vd for the period of time of Tc or longer.

The connector controller 962 transfers the generated third lock signal to the lock mechanism 410 (a third lock control operation). If the value of the voltage V2 remains below the voltage maintenance determination value Vd for the period of time of Tc or longer, the lock mechanism 410 maintains the connector 400a in the lock state in response to the third lock signal.

As the connector controller 942 of the fourth embodiment, the connector controller 962 generates the first lock signal based on the voltage determination result information transferred from the voltage value determination unit 941. If the value of the voltage V2 is equal to or above the voltage determination value Vc, the lock mechanism 410 maintains the connector 400a in the lock state in response to the first lock signal in the same way as in the fourth embodiment.

The lock mechanism 410 thus maintains the connector 400a in the lock state if at least one of the following two conditions holds: (i) the value of the voltage V2 is equal to or above the voltage determination value Vc and (ii) the value of the voltage V2 is equal to or above the voltage maintenance determination value Vd for the period of time Tc or longer.

FIG. 13 illustrates an example where the condition V=V1=400 V, and R=16 kΩ holds. As illustrated in FIG. 13, the value of the insulation resistance Ri is Ri=R=16 kΩ.

Then, V2=V1×{Ri/(R+Ri)}=400 V/{16 kΩ/(16 kΩ+16 kΩ)}=200 V. Since the voltage V of the battery 10 is voltage divided by the insulation resistance Ri, V2=V/2 (=200 V) is applied between the input terminals P2 and Q2 in a steady state.

If the voltage determination value Vc is set to be 300 V and the voltage maintenance determination value Vd is set to be 150 V in the power system 6000, the lock mechanism 410 maintains the connector 400a in the lock state in response to the third lock signal.

Since a steady state with no change with time is presumed in the power system 6000 in the example of FIG. 13, any value is acceptable for the predetermined period of time Tc. For example, Tc=10 seconds.

If a transient change with time is presumed in the power system 6000, the value of Tc may be determined by a time constant of the power system 6000. The time constant of the power system 6000 is determined by the values of the stray capacitance C, the resistor R, and the insulation resistance Ri.

Effect of Power System 6000

The lock mechanism 410 maintains the connector 400a in the lock state in the power system 6000 if at least one of the following two conditions is satisfied: (i) the value of the voltage V2 is equal to or above the voltage determination value Vc, and (ii) the value of the voltage V2 is equal to or above the voltage maintenance determination value Vd for the period of time Tc.

The input terminals P2 and Q2 may now be short-circuited and the voltage V2 between the input terminals P2 and Q2 may now become equal to or below the voltage determination value Vc under the influence of the insulation resistance Ri. Even in such a case, the connector 400a is maintained in the lock state unless it is verified that the voltage V2 is sufficiently decreased with time to become equal to or below the voltage maintenance determination value Vd.

The power system 6000 of the sixth embodiment provides the effect that the safety of the user operating the connector 400a is ensured even if the input terminals P2 and Q2 are short-circuited and the voltage V2 between the input terminals P2 and Q2 remains smaller than the voltage determination value Vc.

The voltage maintenance determination result information generated by the voltage maintenance state determination unit 963 may be used to determine whether a short-circuit occurs between the input terminals P2 and Q2. Referencing the voltage maintenance determination result information is thus used to determine whether a decrease in the voltage V2 between the input terminals P2 and Q2 is caused by a normal operation or a short-circuit between cables or the like.

Modification

As the power system 4000 of the fourth embodiment, the power system 6000 of the sixth embodiment may not necessarily have to include the voltage measurement unit 910, the timer 912, and the master controller 960 in the PCS 96. The power system 6000 works as long as the master controller 960 is included in the connection system 600.

Seventh Embodiment

A seventh embodiment of the disclosure is described with reference to FIG. 14A and FIG. 14B. For convenience of explanation, elements identical to those in the preceding embodiments are designated with the same reference numerals and the discussion thereof is omitted herein.

Configuration of Power System 7000a

FIG. 14A diagrammatically illustrates the configuration of a power system 7000a. The power system 7000a includes EV 1 (a power supply apparatus or a load apparatus), connection system 100, and EV 1a (a power supply apparatus or a load apparatus). The power system 7000a is configured by replacing the PCS 90 in the power system 1000 of the first embodiment with the EV 1a.

The power system 7000a is thus configured by connecting the two EVs, namely, the EV 1 and the EV 1a. The EV 1 and the EV 1a supplies power to each other.

The EV 1 discharges power to the EV 1a in the power system 7000a. In this way, the EV 1 charges the EV 1a. The EV 1 corresponds to the power supply apparatus, and the EV 1a corresponds to the load apparatus.

Similarly, the EV 1a discharges power to the EV 1 in the power system 7000a. In this way, the EV 1a charges the EV 1. The EV 1a corresponds to the power supply apparatus, and the EV 1 corresponds to the load apparatus.

The power system 7000a supplies power from the EV 1 to the EV 1a or from the EV 1a to the EV 1. The power system 7000a with the connection system 100 supplies power to the EV 1 or the EV 1a reliably and safely.

Configuration of Power System 7000b

FIG. 14B illustrates the configuration of a power system 7000b of the seventh embodiment. The power system 7000b includes EV 1 (a load apparatus), connection system 100, and charging power supply apparatus 700. More specifically, the power system 7000b is configured by replacing the EV 1a in the power system 7000a with the charging power supply apparatus 700.

In the power system 7000b, the EV 1 is connected to the charging power supply apparatus 700 via the connection system 100.

The charging power supply apparatus 700 includes an alternating current power supply 701 and a charger 702. The charger 702 is connected to the EV 1 via the connection system 100. The alternating current power supply 701 is connected to the charger 702.

The alternating current power supply 701 is an alternating current (AC) generator, for example. The alternating current power supply 701 supplies AC power to the charger 702. For example, the charger 702 is a battery that stores the AC power. The charger 702 converts the AC power supplied from the alternating current power supply 701 to a direct current appropriate to charge the EV 1.

The EV 1 is connected to the charging power supply apparatus 700 via the connection system 100 in the power system 7000b. The charging power supply apparatus 700 thus supplies power to the EV 1.

With the alternating current power supply 701 operating in the power system 7000b, the charging power supply apparatus 700 supplies power to the EV 1. The EV 1 is thus charged by the charging power supply apparatus 700. The charging power supply apparatus 700 corresponds to the power supply apparatus, and the EV 1 corresponds to the load apparatus.

The power system 7000b is configured so that the charging power supply apparatus 700 supplies power to the EV 1 in one direction only. The power system 7000b with the connection system 100 supplies power from the charging power supply apparatus 700 to the EV 1 reliably and safely.

Modification

The connection system 100 of the first embodiment is employed in the power systems 7000a and 7000b of the seventh embodiment. The power systems 7000a and 7000b are not limited to this configuration. For example, each of the power systems 7000a and 7000b may include one of the connection systems 200 through 600 of the second through sixth embodiments in place of the connection system 100 of the first embodiment.

The power system 7000b is configured so that power is generated using the alternating current power supply 701. A direct-current power supply (direct-current generator) may be employed in place of the alternating current power supply 701. In this case, the charger 702 is free from the function of converting the AC power to the DC power. The charger 702 simply has the function of converting the DC voltage or DC current of the DC power supplied from the DC power supply into values appropriate for charging the EV 1.

Implementation Using Software

Control blocks of the connection systems 400, 500, and 600 (in particular, the master controllers 940, 950, and 960) may be implemented using a logical circuit (hardware) formed on an integrated circuit (IC chip), or may be implemented using a central processing unit (CPU), in other words, using software.

If the control block is implemented using software, each of the connection systems 400, 500, and 600 includes a CPU, a read-only memory (ROM) or a storage device (these elements are hereinafter referred to as a "recording medium"), and a random-access memory (RAM). The CPU executes an instruction of a software program to implement each function. The recording medium stores the program and a variety of data in a computer-readable manner. The RAM expands the program thereon. When the computer (or CPU) reads the program from the recording medium, and executes the program, the benefits of the disclosure are provided. The recording media may be non-transitory physical recording media, including a tape, a disk, a card, a semiconductor memory, and a programmable logical circuit. The program may be supplied to the computer using any transmission medium enabled to transmit the program (such as a communication network or broadcasting wave). The technique of the disclosure may be implemented in the form of a data signal which electronically represents the program and with which a carrier wave is modulated.

Examples

A first aspect of the disclosure is related to a connection system (the connection system 100). The connection system is configured to be connected between voltage output terminals (P1 and Q1) of a power supply apparatus (the EV 1) and voltage input terminals (P2 and Q2) of a load apparatus (the PCS 90) in order to form an electric path between the power supply apparatus and the load apparatus for power transmission. The power supply apparatus includes an over-voltage protection circuit (the relay circuit 11) that opens the electric path if a value of a voltage between the voltage output terminals is equal to or above a predetermined value. The connection system includes an excessive current blocking element (the fuse F) that blows in response to a current equal to or above a predetermined value flowing thereinto, and a resistor (resistor R) connected in parallel with the excessive current blocking element.

Since the excessive current blocking element and the resistor are connected in parallel in the configuration of the connection system, the electric path is maintained via the resistor between the power supply apparatus and the load apparatus even with the excessive current blocking element welded.

The excessive current blocking element may be welded (namely, the over-voltage protection circuit may lose the function of opening the electric path) if an excessive current flows into the over-voltage protection circuit throughout the operation time of the excessive current blocking element. The resistor R on the electric path allows the voltage between the input terminals P2 and Q2 of the load apparatus to be measured. The resistor R on the electric path controls the application of an over voltage between the input terminals P2 and Q2 of the load apparatus.

In the first aspect of the disclosure, the connection system may increase the reliability of the power transmission between the power supply apparatus and the load apparatus.

According to a second aspect of the disclosure, in view of the first aspect, the electric path may be formed by connecting the power supply apparatus to the load apparatus via a connector (connector 300a) in the connection system.

In this configuration, the electric path is even more easily established between the power supply apparatus and the load apparatus. The operation of the user is facilitated when the power supply apparatus is connected to or disconnected from the load apparatus.

According to a third aspect of the disclosure, in view of the second aspect, the excessive current blocking element and the resistor may be arranged within the connector.

In the connection system of the third aspect of the disclosure, the use of the connector increases the reliability of the power transmission between the power supply apparatus and the load apparatus.

According to a fourth aspect of the disclosure, in view of one of the second the third aspects, the connection system may further include a lock mechanism (lock mechanism 410) that maintains the connection state in the electric path in the connector, a connector controller (connector controller 942) that controls the operation of the connector, a voltage value determination unit (voltage value determination unit 941) that determines whether the voltage (V2) between the output terminals P1 and Q1 is equal to or above a voltage determination value (voltage determination value Vc). If the voltage value determination unit determines that the value of the voltage is equal to or above the voltage maintenance determination value, the lock mechanism may be controlled so that the locking operation continues.

If the voltage V2 between the input terminals P2 and Q2 is equal to or above the voltage determination value Vc in the configuration, the connector remains in the connection state even if the user attempts to disconnect the connector.

The safety of the user operating the connector is thus ensured.

According to a fifth aspect of the disclosure, in view of the fourth aspect, the connection system may further include an insulation resistance value determination unit (insulation resistance value determination unit 953) that determines whether the value of an insulation resistance (Ri) between the voltage input terminals is equal to or below a predetermined resistance determination value (Rc). If the insulation resistance value determination unit determines that the value of the insulation resistance is equal to or below the resistance determination value, the lock mechanism is controlled so that the locking operation continues.

With this arrangement, the lock mechanism maintains the connector in the lock state even if the value of the insulation resistance Ri between the input terminals P2 and Q2 is equal to or below the resistance determination value Rc.

The value of the insulation resistance Ri is determined even if the voltage V2 between the input terminals P2 and Q2 is equal to or below the voltage determination value Vc with the input terminals P2 and Q2 short-circuited. The connector is maintained in the connection state unless the insulation between the input terminals P2 and Q2 is verified.

The safety of the user operating the connector is thus ensured even if the input terminals P2 and Q2 are short-circuited.

According to a sixth aspect of the disclosure, in view of one of the fourth and fifth aspects, the connection system may further include a voltage maintenance state determination unit (voltage maintenance state determination unit 963) that determines whether the value of the voltage between the input terminals P2 and Q2 is equal to or above a voltage maintenance determination value (Vd) for a predetermined period of time (Tc) or longer. If the voltage maintenance determination value is lower than the voltage determination value, and the voltage maintenance state determination unit determines that the value of the voltage is equal to or above the voltage maintenance determination value for the predetermined period of time or longer, the lock mechanism is controlled so that the locking operation continues.

The lock mechanism maintains the connector in the lock state if the value of the voltage V2 between the input terminals P2 and Q2 is equal to or above the voltage maintenance determination value Vd for the predetermined period of time Tc or longer.

A stray capacitance, if present between the output terminals P1 and Q1, stores the voltage from the power supply apparatus for a relatively long period of time. The voltage V2 between the input terminals P2 and Q2 of the load apparatus is thus affected by the stray capacitance C.

The voltage V2 between the input terminals P2 and Q2 may become equal to or below the voltage determination value Vc in the power system in the power system. Unless it is verified that the voltage V2 becomes low enough with time to be equal to or below the voltage determination value Vc, the connector is maintained in the connection state.

The safety of the user operating the connector is ensured even if the voltage determination value V2 between the input terminals P2 and Q2 remains lower than the voltage determination value Vc in a steady state.

According to a seventh aspect of the disclosure, in view of the one of the first through sixth aspects, the value of a resistor (Rm) may be selected so that the value of a current (Im) flowing through the electric path is equal to or below an upper limit value of currents regulated in Technical Specification IEC60479-1 from the safety standpoint.

With this arrangement, the connection system thus increases the safety of the user.

According to an eight aspect of the disclosure, in view of the seventh aspect, the value of the resistor may be selected so that the value of the current is 25 mA or lower.

With this arrangement, the safety of the user is increased in the connection system by using, as the upper limit value of the current, a specific value regulated in Technical Specification IEC60479-1 from the safety standpoint.

According to a ninth aspect of the disclosure, a power system (power system 1000) may include one of the connection systems of the first through eighth aspects, the power supply apparatus, and the load apparatus. The power supply apparatus is connected to the load apparatus via the connection system.

With this arrangement, the use of the connection system allows power to be transmitted reliably and safely between the power supply apparatus and the load apparatus in the power system.

According to a tenth aspect of the disclosure, in view of the ninth aspect, the power supply apparatus may be an electric vehicle.

With this arrangement, the power transmission is performed reliably and safely by the electric vehicle.

According to an eleventh aspect of the disclosure, in view of one of the ninth and tenth aspects, the load apparatus in the power system may be a power conditioner.

With this arrangement, the power conditioner converts power supplied from the power supply apparatus and the converted power is used in a variety of applications.

A twelfth aspect of the disclosure is related to a control method of the connection system of the fourth aspect. The control method may include a voltage value determination operation to determine whether the value of voltage between the voltage input terminals is equal to or above the predetermined voltage determination value, and a first lock control operation to control the lock mechanism to continue the locking operation if it is determined in the voltage value determination operation that the value of the voltage is equal to or above the voltage determination value.

With this arrangement, the safety of the user operating the connector is ensured in the same way as in the connection system of the fourth aspect.

According to a thirteenth aspect of the disclosure, in view of the twelfth aspect, the control method of the connection system may include an insulation resistance value determination operation to determine whether the value of an insulation resistance between the voltage input terminals is equal to or below a predetermined resistance determination value, and a second lock control operation to control the lock mechanism to continue the locking operation if it is determined in the insulation resistance value determination operation that the value of the insulation resistance is equal to or below the resistance determination value.

With this arrangement, the safety of the user operating the connector is ensured in the same way as in the connection system of the fifth aspect.

According to a fourteenth aspect of the disclosure, in view of one of the twelfth and thirteen aspects, the control method of the connection system may include a voltage maintenance state determination operation to determines whether the value of the voltage between the voltage input terminals remains equal to or above a voltage maintenance determination value for a predetermined period of time or longer, and a third lock control operation to control the lock mechanism to continue the locking operation if it is determined in the voltage maintenance state determination operation that the value of the voltage remains equal to or above the voltage maintenance determination value for the predetermined period of time or longer. The voltage maintenance determination value is desirably lower than the voltage determination value.

With this arrangement, the safety of the user operating the connector is ensured in the same way as in the connection system of the sixth aspect.

The connection system of one of the fourth through eighth aspects may be implemented using a computer. The computer then operates as each element included in the connection system. A control program of the connection system implemented by the computer, and a computer readable recording medium storing the control program fall within the scope of the disclosure.

The techniques of the disclosure are not limited to the above-described embodiments. A variety of changes is possible within the scope defined by the claims. An embodiment resulting from combining the techniques disclosed in the different embodiments also falls within the scope of the disclosure. Also, the combination of the techniques disclosed in the different embodiments may lead to a new technical feature.

The disclosure may also be described as below.

According to another aspect of the disclosure, a connection unit may include a wiring that is connected between a power supply and a load apparatus including an input unit having a voltage measurement unit in order to supply power, an excessive current blocking unit that is included in the wiring and protects the wiring if an excessive current flows through the wiring, and a resistor that is connected in parallel with the excessive current blocking unit.

In another aspect of the disclosure, the resistor in the connection unit has a resistance value that controls a flowing current to a level that does not affect the human body if electrocuted to the current.

In another aspect of the disclosure, the power source is connected to the wiring via a connector in the connection unit.

In another aspect of the disclosure, the connector includes a lock mechanism controlling disconnection in the connection unit. The lock mechanism maintains the lock state unless the voltage becomes equal to or below a predetermined value.

In another aspect of the disclosure, a connection system includes an insulation measurement unit measuring insulation of the connection unit. The connection system continues to maintain the lock state if the insulation resistance remains equal to or below a predetermined value.

In another aspect of the disclosure, the connection system continues to maintain the lock state if the voltage falls down to be equal to or below a low value but falls no longer to an even lower value after a predetermined duration of time.

In another aspect of the disclosure, a power system includes the connection system.

The technology of the disclosure is applicable to the connection system that connects the power supply apparatus and the load apparatus.

The present disclosure contains subject matter related to that disclosed in Japanese Priority Patent Application JP 2014-011464 filed in the Japan Patent Office on Jan. 24, 2014, the entire contents of which are hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A connection system configured to be connected between voltage output terminals of a power source apparatus and voltage input terminals of a load apparatus in order to form an electric path between the power source apparatus and the load apparatus for power transmission, the connection system comprising in the electric path:
   an excessive current blocking element that blows in response to a current equal to or above a predetermined value flowing thereinto; and
   a resistor connected in parallel with the excessive current blocking element,
   wherein the power source apparatus includes an overvoltage protection circuit that opens the electric path if a value of a voltage between the voltage output terminals is equal to or above a predetermined value.

2. The connection system according to claim 1, wherein the electric path is formed by connecting the power source apparatus to the load apparatus via a connector.

3. The connection system according to claim 2, wherein the excessive current blocking element and the resistor are arranged within the connector.

4. The connection system according to claim 2, further comprising:
   a lock mechanism that performs a locking operation to maintain the electric path of the connector to be in a connection state;
   a connector controller that controls the locking operation; and
   a voltage value determination unit that determines whether the value of the voltage between the voltage input terminals is equal to or above a predetermined voltage determination value,
   wherein if the voltage value determination unit determines that the value of the voltage is equal to or above the predetermined voltage determination value, the connector controller controls the lock mechanism so that the locking operation continues.

5. The connection system according to claim 4, further comprising an insulation resistance value determination unit that determines whether a value of an insulation resistance between the voltage input terminals is equal to or below a predetermined resistance determination value,
   wherein if the insulation resistance value determination unit determines that the value of the insulation resistance is equal to or below the predetermined resistance determination value, the connector controller controls the lock mechanism so that the locking operation continues.

6. The connection system according to claim 4, further comprising a voltage maintenance state determination unit that determines whether the value of the voltage between the voltage input terminals remains equal to or above a voltage maintenance determination value throughout a predetermined period of time or longer, wherein the voltage maintenance determination value is lower than the predetermined voltage determination value, and wherein if the voltage maintenance state determination unit determines that the value of the voltage between the voltage input terminals remains equal to or above the voltage maintenance determination value throughout the predetermined period of time or longer, the connector controller controls the lock mechanism so that the locking operation continues.

7. The connection system according to claim 1, wherein a resistance value of the resistor is selected so that a value of a current flowing through the electric path is equal to or below an upper limit value of currents regulated in Technical Specification IEC60479-1 from a safety standpoint.

8. The connection system according to claim 7, wherein the resistance value of the resistor is selected so that the value of the current is 25 mA or lower.

9. A power system comprising the connection system, the power source apparatus, and the load apparatus according to claim 1, wherein the power source apparatus is connected to the load apparatus via the connection system.

10. The power system according to claim 9, wherein the power source apparatus comprises an electric vehicle.

11. The power system according to claim 9, wherein the load apparatus comprises a power conditioner.

12. A method of controlling the connection system according to claim 4, comprising:

determining whether the value of the voltage between the voltage input terminals is equal to or above the predetermined voltage determination value; and controlling the lock mechanism to continue the locking operation if the value of the voltage is determined to be equal to or above the predetermined voltage determination value.

13. The method according to claim 12, further comprising:

determining whether the value of the insulation resistance between the voltage input terminals is equal to or below the predetermined resistance determination value; and controlling the lock mechanism to continue the locking operation if the value of the insulation resistance is determined to be equal to or below the predetermined resistance determination value.

14. The method according to claim 12, further comprising:

determining whether the value of the voltage between the voltage input terminals is equal to or above the voltage maintenance determination value for the predetermined period of time or longer; and controlling the lock mechanism to continue the locking operation if the value of the voltage between the voltage input terminals is determined to be equal to or above the voltage maintenance determination value for the predetermined period of time or longer, wherein the voltage maintenance determination value is lower than the voltage determination value.

15. The method according to claim 12, wherein a resistance value of the resistor is selected so that a value of a current flowing through the electric path is equal to or below an upper limit value of currents regulated in Technical Specification IEC60479-1 from a safety standpoint.

16. The method according to claim 15, wherein the resistance value of the resistor is selected so that the value of the current is 25 mA or lower.

* * * * *